United States Patent
Xi et al.

(10) Patent No.: US 12,536,967 B2
(45) Date of Patent: Jan. 27, 2026

(54) DRIVE CIRCUIT AND DRIVE METHOD THEREOF, AND PANEL AND DRIVE METHOD THEREOF

(71) Applicant: Shanghai AVIC OPTO Electronics Co., Ltd., Shanghai (CN)

(72) Inventors: Kerui Xi, Shanghai (CN); Xiaohe Li, Shanghai (CN); Feng Qin, Shanghai (CN); Jine Liu, Shanghai (CN); Tingting Cui, Shanghai (CN); Baiquan Lin, Shanghai (CN)

(73) Assignee: Shanghai AVIC OPTO Electronics Co., Ltd., Shanghai (CN)

( * ) Notice: Subject to any disclaimer, the term of this patent is extended or adjusted under 35 U.S.C. 154(b) by 928 days.

(21) Appl. No.: 17/733,534

(22) Filed: Apr. 29, 2022

(65) Prior Publication Data

US 2022/0270555 A1 Aug. 25, 2022

Related U.S. Application Data

(63) Continuation of application No. 16/457,939, filed on Jun. 29, 2019, now Pat. No. 11,376,585.

(30) Foreign Application Priority Data

Apr. 4, 2019 (CN) .......................... 201910272250.3

(51) Int. Cl.
*G09G 3/34* (2006.01)
*B01L 3/00* (2006.01)
(Continued)

(52) U.S. Cl.
CPC ........ *G09G 3/348* (2013.01); *B01L 3/502715* (2013.01); *B01L 3/50273* (2013.01);
(Continued)

(58) Field of Classification Search
CPC ........... G09G 3/348; G09G 2300/0426; G09G 2300/0876; G09G 2310/0243; G09G 3/34;
(Continued)

(56) References Cited

U.S. PATENT DOCUMENTS

| 6,924,792 | B1 * | 8/2005 | Jessop | G02B 26/004 345/48 |
| 8,519,406 | B2 * | 8/2013 | Yoon | H10K 85/20 345/204 |
| 2004/0169548 | A1 | 9/2004 | Nonaka | |
| 2007/0040795 | A1 * | 2/2007 | Lee | G09G 3/3648 345/100 |

(Continued)

FOREIGN PATENT DOCUMENTS

| CN | 1280974 C | 10/2006 |
| CN | 103208246 A | 7/2013 |
| CN | 108593724 A | 9/2018 |

*Primary Examiner* — Lunyi Lao
*Assistant Examiner* — Jarurat Suteerawongsa
(74) *Attorney, Agent, or Firm* — Anova Law Group, PLLC

(57) ABSTRACT

A panel and its drive method are provided. The panel includes: a substrate, an array layer and an electrode array layer, where the array layer is on a side of the substrate; the electrode array layer is on a side of the array layer away from the substrate; and the array layer includes an active layer, a gate metal layer and a source/drain metal layer; the substrate includes a plurality of drive units arranged in an array, a plurality of scan line groups and a plurality of data line groups; the scan line group includes first scan lines and second scan lines adjacent to the first scan lines, extending in a first direction; and the data line group includes first data lines and second data lines adjacent to the first data lines, extending in a second direction.

19 Claims, 22 Drawing Sheets

(51) Int. Cl.
*G01N 27/22* (2006.01)
*H03K 17/687* (2006.01)
*H10D 86/40* (2025.01)
*H10D 86/60* (2025.01)

(52) U.S. Cl.
CPC ......... *G01N 27/228* (2013.01); *H03K 17/687* (2013.01); *H10D 86/423* (2025.01); *H10D 86/441* (2025.01); *H10D 86/60* (2025.01); *B01L 2400/0427* (2013.01); *G09G 2300/0426* (2013.01)

(58) Field of Classification Search
CPC ........... B01L 3/502715; B01L 3/50273; B01L 2400/0427; B01L 2300/0645; B01L 2300/165; B01L 3/502792; G01N 27/228; H03K 17/687; H10D 86/423; H10D 86/441; H10D 86/60; H10D 86/481
See application file for complete search history.

(56) References Cited

U.S. PATENT DOCUMENTS

| | | | |
|---|---|---|---|
| 2009/0103036 A1* | 4/2009 | Onodera | H10D 86/441 349/144 |
| 2013/0177128 A1 | 7/2013 | Ko et al. | |
| 2014/0299843 A1* | 10/2014 | Kim | H10D 86/441 438/23 |
| 2014/0306923 A1* | 10/2014 | Brillant | G06F 3/0446 345/174 |
| 2017/0047391 A1* | 2/2017 | You | H10D 30/6704 |
| 2020/0184894 A1 | 6/2020 | Shi et al. | |

* cited by examiner

DRIVE CIRCUIT AND DRIVE METHOD THEREOF, AND PANEL AND DRIVE METHOD THEREOF

CROSS-REFERENCE TO RELATED APPLICATION

This application is a continuation application of U.S. patent application Ser. No. 16/457,939, filed on Jun. 29, 2019, which claims the priority of Chinese Patent Application No. 201910272250.3, filed on Apr. 4, 2019, the content of which is incorporated herein by reference in its entirety.

TECHNICAL FIELD

The present disclosure generally relates to the field of drive technology and, more particularly, relates to a drive circuit and its drive method, and a panel and its drive method.

BACKGROUND

Microfluidic technology is an emerging interdisciplinary subject involving chemistry, fluid physics, microelectronics, new materials, biology and biomedical engineering, which may precisely manipulate the movement of droplets, implement the fusion and separation of droplets, and complete various biological and chemical reactions. Microfluidic technology is a technology mainly characterized by manipulating fluids in the range of micrometers, and has developed the interdisciplinary subjects with chemistry, biology, engineering, physics, etc., and has demonstrated a broad range of application prospects. The microfluidic chips is the main platform type for implementing the microfluidic technology. The basic operation units such as sample preparation, reaction, separation and detection of biological, chemical and medical analysis processes may be integrated into the micro-scale microfluidic chips, and the whole analysis process may be automatically completed on the microfluidic chips. In recent years, the microfluidic chips have advantages such as small size, low power consumption, low cost, low sample and reagent quantities, separate and precise manipulation of the droplets, short detection time, high sensitivity, and easy integration with other devices, so they are widely used in biology, chemistry, medicine and other fields.

In the conventional technology, the microfluidic devices may include control circuits and drive electrodes. The control circuits may be configured to supply voltage to the drive electrodes, so an electric field may be formed between adjacent drive electrodes and the droplets may move under the driving action of the electric field. The control circuits may use passive drive chips. However, the driving ability of the passive drive chips may be limited, and a large number of the drive electrodes may be required when large-scale chemical micro-reactions or substance detections are needed simultaneously. In order to provide signals to a large number of the drive electrodes, the drive chips may be required to have a large number of signal channels (pins), which may not be supported by current passive drive chips.

In the conventional technology, the signal channels of the drive chips may be reduced by configuring the drive electrodes and the control circuits in an array, and the drive chips used may be the active drive chips. However, in the conventional technology, the drive voltage outputted by the active drive chips may be different from the voltage that may drive the droplets to move. The voltage for driving the droplets to move may be about 50 V. According to the drive voltage of the active drive chips in the conventional technology, the high-voltage drive chips may only provide a drive voltage of about 30 V, so the existing active drive chips may have a problem of insufficient drive voltage.

Therefore, how to improve the microfluidic devices to implement large-scale sample detections and reactions may be a technical problem to be solved in the microfluidic field.

SUMMARY

One aspect of the present disclosure provides a drive circuit. The drive circuit includes a step-up unit, a plurality of signal input terminals and a signal output terminal, electrically connected with each other. The step-up unit includes a first module, a second module and a first capacitor, electrically connected with each other. The plurality of signal input terminals includes a first signal input terminal, a second signal input terminal, a third signal input terminal and a fourth signal input terminal. The first module is electrically connected to each of the first signal input terminal, the third signal input terminal, and a first electrode of the first capacitor; and the first module is configured to transmit a signal of the third signal input terminal to the first electrode of the first capacitor. The second module is electrically connected to each of a second electrode of the first capacitor, the second signal input terminal and the fourth signal input terminal; and the second module is configured to transmit a signal in a first time period of the fourth signal input terminal to the second electrode of the first capacitor, to generate a voltage difference between the first and second electrodes of the first capacitor; and to transmit the signal in a second time period of the fourth signal input terminal to the second electrode of the first capacitor, to further increase the signal of the first electrode of the first capacitor. The first electrode of the first capacitor is electrically connected to the signal output terminal to output a high potential signal.

Another aspect of the present disclosure provides a drive method of a drive circuit configured to drive the drive circuit. The drive method includes: a first phase, where a high potential signal of the third signal input terminal is transmitted to a first electrode of the first capacitor through the first module, and a low potential signal of the fourth signal input terminal is transmitted to a second electrode of the first capacitor through the second module, thereby generating a voltage difference between two electrodes of the first capacitor; a second phase, where a high potential signal of the fourth signal input terminal is transmitted to the second electrode of the first capacitor through the second module, thereby increasing the potential signal of the first electrode of the first capacitor; and a third phase, where the increased potential signal maintained by the first electrode of the first capacitor is outputted through the signal output terminal.

Another aspect of the present disclosure provides a panel. The panel includes: a substrate, an array layer and an electrode array layer, where the array layer is on a side of the substrate; the electrode array layer is on a side of the array layer away from the substrate; and the array layer includes an active layer, a gate metal layer and a source/drain metal layer; the substrate includes a plurality of drive units arranged in an array, a plurality of scan line groups and a plurality of data line groups; the scan line group includes first scan lines and second scan lines adjacent to the first scan lines, extending in a first direction; and the data line group includes first data lines and second data lines adjacent to the first data lines, extending in a second direction, where the first direction is perpendicular with the second direction; the electrode array layer includes a plurality of drive electrodes arranged in an array; the drive electrodes correspond to the drive units; and the drive unit includes a first transistor, a second transistor and a first capacitor; a gate of the first transistor is electrically connected to the first scan line; a source of the first transistor is electrically connected to the first data line; a drain of the first transistor is electrically connected to the drive electrode; and the drive electrode is electrically connected to a first electrode of the first capacitor; and a gate of the second transistor is electrically connected to the second scan line; a source of the second transistor is electrically connected to the second data line; and a drain of the second transistor is electrically connected to a second electrode of the first capacitor.

Another aspect of the present disclosure provides a drive method of a panel. The panel according to the embodiments in the present disclosure includes a plurality of drive units arranged in an array. The drive method includes forming an electric field between adjacent drive electrodes on the panel by modifying potential signals received from the data line group of two adjacent drive units. The panel includes a first drive unit and a second drive unit, which are adjacent to each other, arranged in the second direction sequentially; the electric field is formed between the first drive unit and the second drive unit; for the first drive unit and the second drive unit, the first scan line is configured to receive a first enable signal and the second scan line is configured to receive a second enable signal, which makes the first transistor and the second transistor to be conducting; a low potential signal is transmitted to the data line group of the first drive unit, a high potential signal is transmitted to the first data line of the second drive unit and a low potential signal is transmitted to the second data line of the second drive unit, which makes the potential of the first electrode of the first capacitor of the first drive unit to be the low potential signal, makes the potential of the second electrode of the first capacitor of the first drive to be the low potential signal, makes the potential of the first electrode of the first capacitor of the second drive unit to be the high potential signal, and makes the potential of the second electrode of the first capacitor of the second drive to be the low potential signal; such that the potential of the drive electrode of the first drive unit is lower than the potential of the drive electrode of the second drive unit. For the first drive unit and the second drive unit, the first scan line disconnects the first enable signal and the second scan line continues to receive the second enable signal, which makes the first transistor to be cutoff and makes the second transistor continue to be conducting; the low potential signal continues to be transmitted to the data line group of the first drive unit, the low potential signal continues to be transmitted to the first data line of the second drive unit, and the high potential signal continues to be transmitted to the second data line of the second drive unit, which makes the potential of the first electrode of the first capacitor of the second drive unit to be further increased, such that the potential of the drive electrode of the first drive unit is further lower than the potential of the drive electrode of the second drive unit.

Another aspect of the present disclosure provides a panel. The panel includes a substrate, an array layer, and an electrode array layer, where the array layer is on a side of the substrate; the electrode array layer is on a side of the array layer away from the substrate; and the array layer includes an active layer, a gate metal layer, and a source/drain metal layer; the substrate includes a plurality of drive units arranged in an array, a plurality of scan lines and a plurality of data lines; the plurality of scan lines extend in a first direction, the plurality of data lines extend in a second direction, where the first direction is perpendicular with the second direction; the electrode array layer includes a plurality of drive electrodes arranged in an array; the drive electrodes correspond to the drive units; and the drive unit includes a first transistor and a capacitor; a gate of the first transistor is electrically connected to the plurality of scan lines; a source of the first transistor is electrically connected to the plurality of data lines; a drain of the first transistor is electrically connected to the drive electrode; and the drive electrode is electrically connected to a first electrode of the capacitor; and the drive electrode is overlapping at least one of the plurality of data lines and the plurality of scan lines.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure. Drawings incorporated in the specification and forming part of the specification demonstrate embodiments of the present disclosure and, together with the specification, describe the principles of the present disclosure.

DETAILED DESCRIPTION

Figure 1:
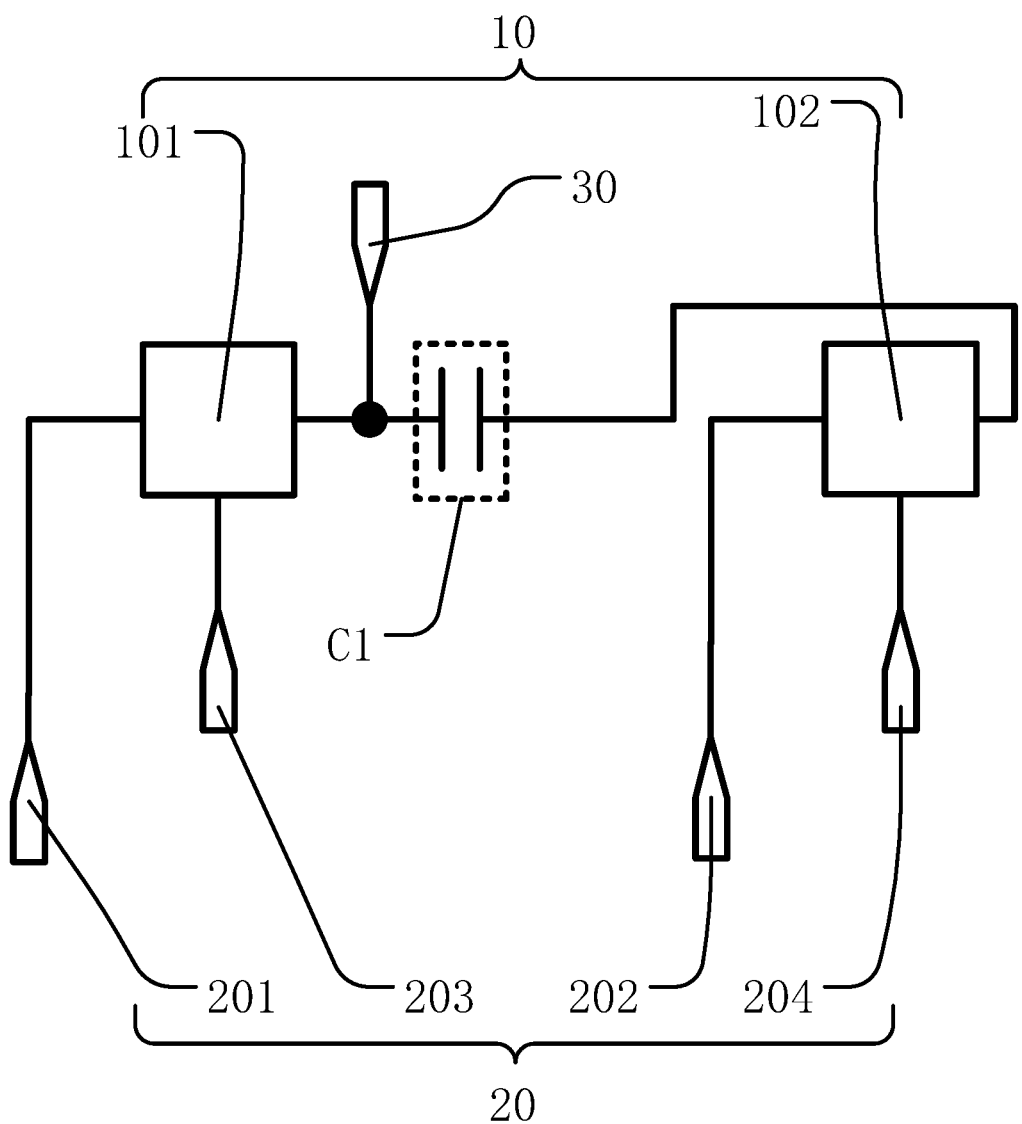
FIG. 1 illustrates a structural schematic of an exemplary drive circuit according to embodiments of the present disclosure.

Reference will now be made in detail to exemplary embodiments of the disclosure, which are illustrated in the accompanying drawings. Wherever possible, the same reference numbers will be used throughout the drawings to refer to the same or like parts.

Various exemplary embodiments of the present disclosure will be described in detail with reference to the drawings. It should be noted that the relative arrangements of components and steps, numerical expressions and numerical values set forth in the embodiments are not intended to limit the scope of the present disclosure unless otherwise specified.

The following description of at least one exemplary embodiment is merely illustrative, and not as any limitations on the present disclosure and its application or use.

Techniques, methods and instruments known to those skilled in the art may not be discussed in detail, but where appropriate, the techniques, methods and instruments should be considered as part of the specification.

In all of the examples illustrated and discussed herein, any specific values should be construed as merely illustrative, and not as a limitation. Thus, other examples of the exemplary embodiments may have different values.

It should be noted that similar reference numerals and letters refer to similar items in the following figures, and therefore, once an item is defined in a figure, it is not required to be further discussed in the subsequent figures.

Referring to FIG. 1, FIG. 1 illustrates a structural schematic of an exemplary drive circuit according to embodiments of the present disclosure. A drive circuit provided in one embodiment may include a step-up unit 10, a plurality of signal input terminals 20, and a signal output terminal 30, which may be electrically connected with each other. The step-up unit 10 may include a first module 101, a second module 102 and a first capacitor C1, which are electrically connected with each other. The plurality of signal input terminals 20 may include a first signal input terminal 201, a second signal input terminal 202, a third signal input terminal 203 and a fourth signal input terminal 204.

The first module 101 may be electrically connected to each of the first signal input terminal 201, the third signal input terminal 203, and a first electrode of the first capacitor C1. The first module 101 may be configured to transmit a signal of the third signal input terminal 203 to the first electrode of the first capacitor C1.

The second module 102 may be electrically connected to each of a second electrode of the first capacitor C1, the second signal input terminal 202, and the fourth signal input terminal 204. The second module 102 may be configured to:

transmit a signal of the fourth signal input terminal 204 to the second electrode of the first capacitor C1 at a first time period which may generate a voltage difference between two electrodes of the first capacitor C1; and transmit the signal of the fourth signal input terminal 204 to the second electrode of the first capacitor C1 at a second time period, which may further increase the signal of the first electrode of the first capacitor C1.

The first electrode of the first capacitor C1 may be electrically connected to the signal output terminal 30, which may be configured to output a high potential signal.

For example, the drive circuit provided by the present disclosure may transmit the signal of the third signal input terminal 203 to the first electrode of the first capacitor C1 through the first module 101, and may transmit the signal of the fourth signal input terminal 204 to the second electrode of the first capacitor C1 through the second module 102 at the first time period, which may generate a voltage difference between the first electrode and the second electrode of the first capacitor C1. Then, the current signal of the fourth signal input terminal 204 may be transmitted to the second electrode of the first capacitor C1 through the second module 102 at the second time period. Currently, the first module 101 may not operate, and the first capacitor C1 may be subject to the coupling effect where a voltage difference between two electrodes of the first capacitor C1 may remain unchanged; and the signal of the fourth signal input terminal 204 may be transmitted to the second electrode of the first capacitor C1 through the second module 102. Therefore, the signal of the first electrode of the first capacitor C1 may be further increased. In one embodiment, the input signals of the first signal input terminal 201 and the second signal input terminal 202 may control the conduction of the first module 101 and the second module 102 at the first time period, and may control the turn-off of the first module 101 and the conduction of the second module 102 at the second time period, and the signals of the third signal input terminal 203 and the fourth signal input terminal 204 may be respectively transmitted to the two electrodes of the first capacitor C1 at the two time periods. Therefore, after forming the voltage difference between the first electrode and the second electrode of the first capacitor C1, the potential signal of the first electrode of the first capacitor C1 may be further increased to obtain a higher potential signal, thereby implementing the function of low voltage input and high voltage output of the drive circuit, which may be advantageous to implement the step-up drive circuit. Moreover, the drive circuit provided in one embodiment may be applied to a microfluidic device, and the drive chip providing the drive signal may not be needed to configure a large number of signal channels when the microfluidic device needs a large number of drive electrodes to simultaneously perform chemical micro-reactions or substance detections of large quantities of samples, which may be advantageous to reduce the computational difficulty of the drive chip, and to provide a sufficient high drive voltage for the droplets to move normally.

It should be noted that the structures of the first module 101 and the second module 102 may not be limited in one embodiment. The structure of each module may be designed according to actual situations in the implementation and may only be needed to realize the step-up function of the drive circuit.

Figure 2:
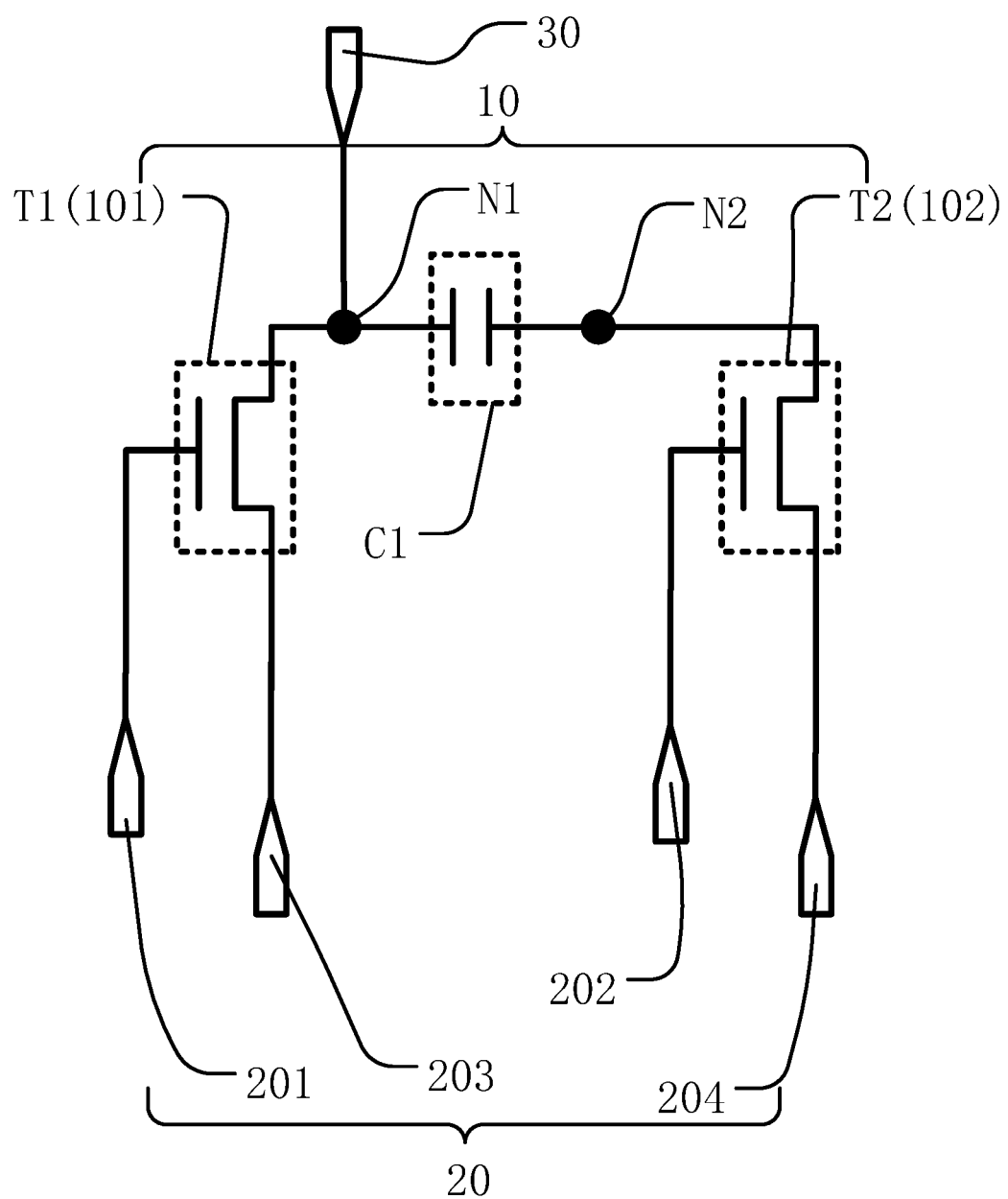
FIG. 2 illustrates a structural schematic of another exemplary drive circuit according to embodiments of the present disclosure.
Figure 3:
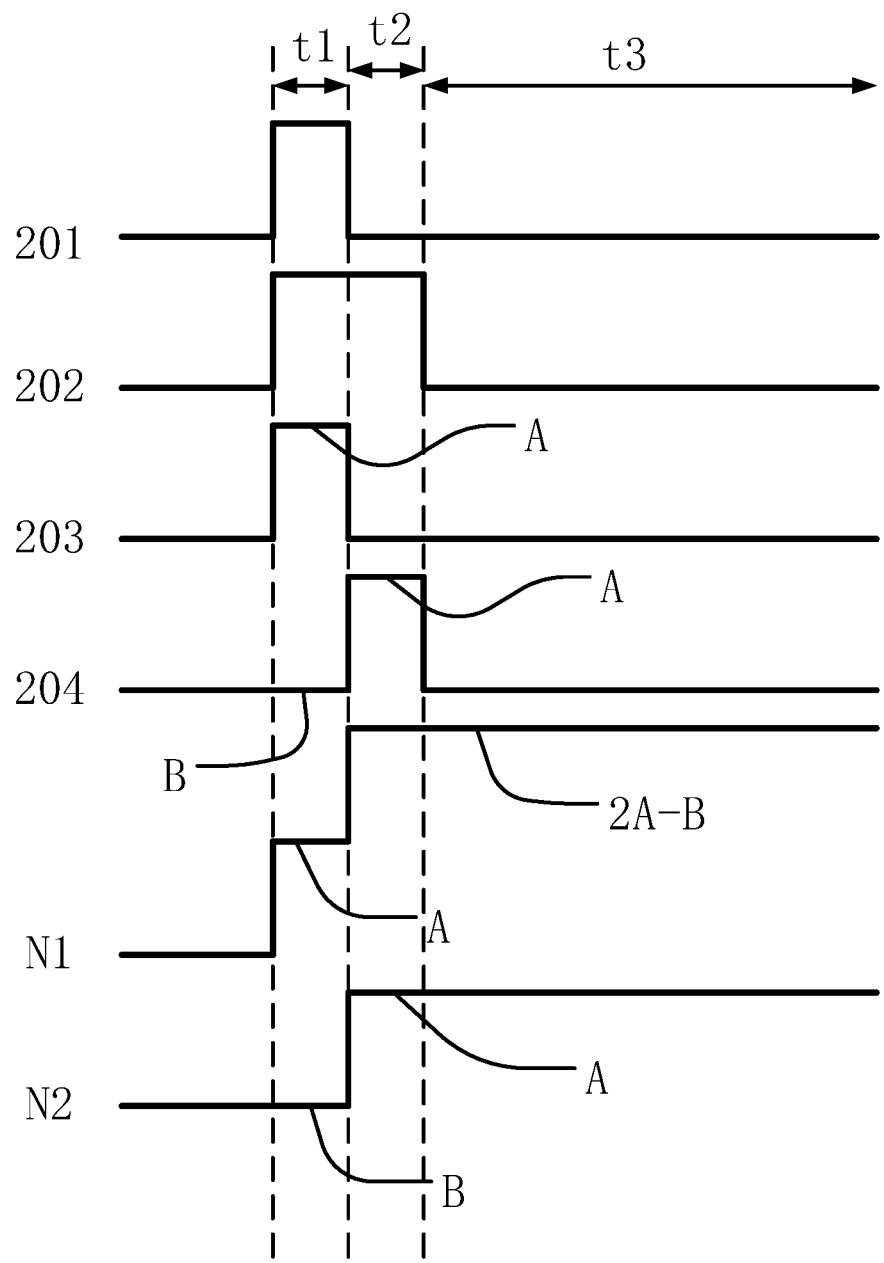
FIG. 3 illustrates a drive sequence schematic corresponding to a high potential signal outputted by the drive circuit provided in FIG. 2.

In some embodiments, referring to FIG. 2 and FIG. 3, FIG. 2 illustrates a structural schematic of an exemplary drive circuit according to embodiments of the present disclosure. FIG. 3 illustrates a drive sequence schematic corresponding to a high potential signal outputted by the drive circuit provided in FIG. 2. In one embodiment, the first module 101 may include a first transistor T1. A gate of the first transistor T1 may be electrically connected to the first signal input terminal 201. A first electrode of the first transistor T1 may be electrically connected to the first electrode of the first capacitor C1, and a second electrode of the first transistor T1 may be electrically connected to the third signal input terminal 203.

The second module 102 may include a second transistor T2. A gate of the second transistor T2 may be electrically connected to the second signal input terminal 202. A first electrode of the second transistor T2 may be electrically connected to the second electrode of the first capacitor C1, and a second electrode of the second transistor T2 may be electrically connected to the fourth signal input terminal 204.

A first node N1 may be configured between the first electrode of the first transistor T1 and the first electrode of the first capacitor C1. A second node N2 may be configured between the second electrode of the first capacitor C1 and the first electrode of the second transistor T2. The first node N1 may be electrically connected to the signal output terminal 30.

Figure 4:
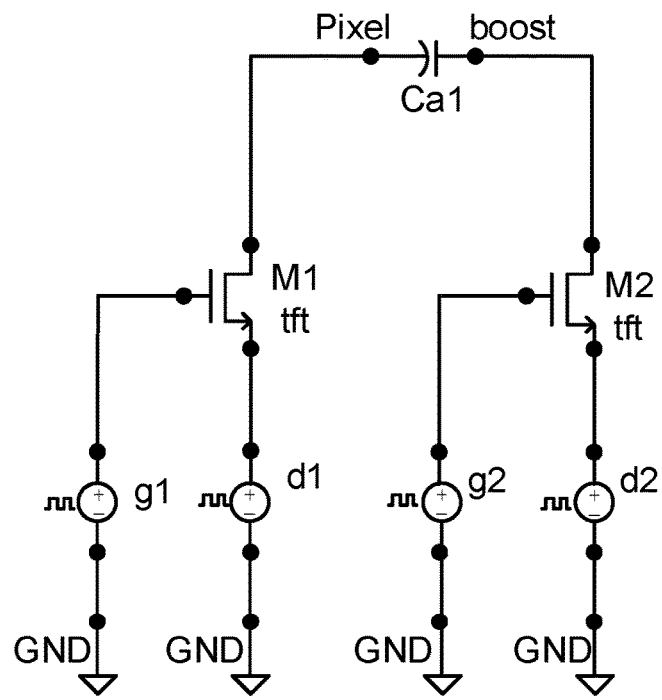
FIG. 4 illustrates a simulation circuit schematic corresponding to FIG. 2.
Figure 5:
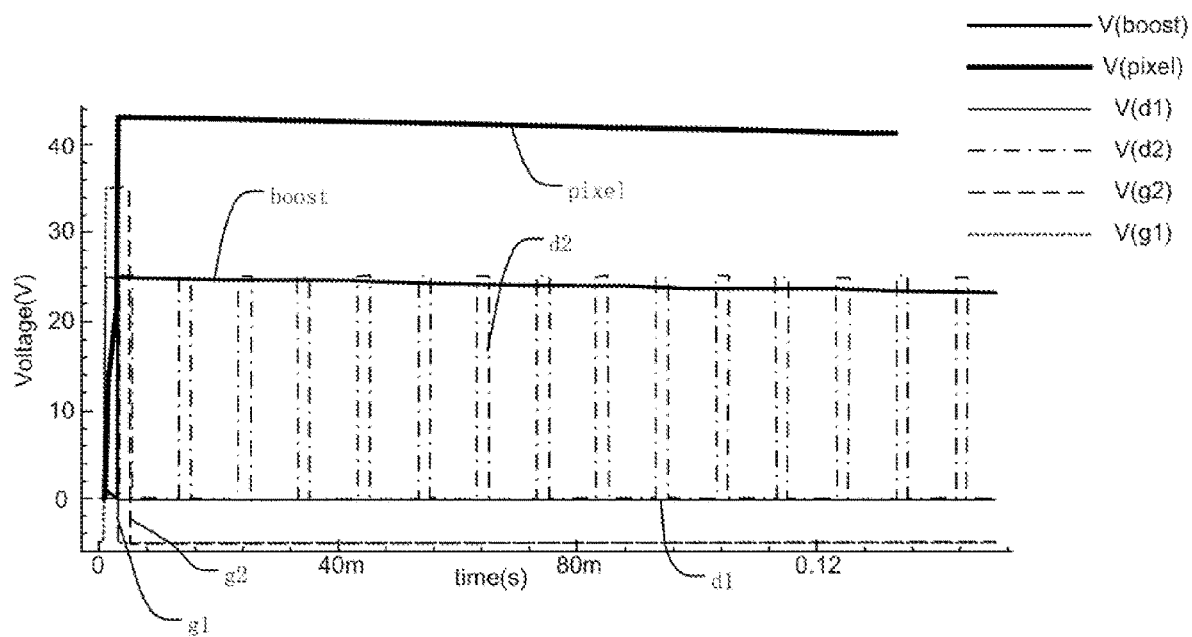
FIG. 5 illustrates a simulation result schematic implemented by the drive sequence of FIG. 3 and the simulation circuit of FIG. 4.

In one embodiment, it may further describe the structures and the electrical connection relationship of the first module 101 and the second module 102. The first module 101 may include the first transistor T1 and the second module 102 may include the second transistor T2. For the operation of the drive circuit in one embodiment, refer to FIGS. 2-5. Both the first transistor T1 and the second transistor T2, which are N-type switch transistors, may be illustrated in FIG. 3 as an example. FIG. 4 illustrates a simulation circuit schematic corresponding to FIG. 2. In FIG. 4, M1 may correspond to the first transistor T1 in FIG. 2; M2 may correspond to the second transistor T2 in FIG. 2; Ca1 may correspond to the first capacitor C1 in FIG. 2; Pixel may correspond to the first node N1 in FIG. 2; boost may correspond to the second node N2 in FIG. 2; g1 may correspond to the first signal input terminal 201; g2 may correspond to the second signal input terminal 202; d1 may correspond to the third signal input terminal 203; and d2 may correspond to the fourth input terminal 204. FIG. 5 illustrates a simulation result schematic implemented by the drive sequence of FIG. 3 and the simulation circuit of FIG. 4. It should be noted that, in order to facilitate the simulation, an overtime treatment may be performed on d1 and d2 having supplied signals in FIG. 5. It can be understood that the working phase of d1 and d2 may be only the phase that g1 and g2 have signals supplied.

In a first time period t1, the first signal input terminal 201 and the second signal input terminal 202 may input a high potential signal to the gate of the first transistor T1 and the gate of the second transistor T2, so both the first transistor T1 and the second transistor T2 may be conducting. A high potential signal A of the third signal input terminal 203 may be transmitted to the first node N1 through the first transistor T1, and a low potential signal B of the fourth signal input terminal 204 may be transmitted to the second node N2 through the second transistor T2, where A may be greater than B. The voltage difference between the two electrodes of the first capacitor C1 may be a difference (A−B) between the potential of the first node N1 and the potential of the second node N2.

In a second time period t2, the first signal input terminal 201 may input a low potential signal to the gate of the first transistor T1, and the second signal input terminal 202 may continue to input the high potential signal to the gate of the second transistor T2, so the first transistor T1 may be cutoff, and the second transistor T2 may continue to be conducting. The high potential signal A of the fourth signal input terminal 204 may be transmitted to the second node N2 through the second transistor T2, so the potential of the second node N2 may be A. Currently, the first transistor T1 may be cutoff and the first capacitor C1 may be subject to the coupling effect, and the voltage difference between the two electrodes may remain unchanged, so the potential of the first node N1 may be increased to (A+(A−B))=(2A−B).

In a third time period t3, the increased potential (2A−B) maintained by the first electrode of the first capacitor C1 may be outputted through the signal output terminal 30.

In one embodiment, the function of low voltage input, high voltage or even higher voltage output of the drive circuit may be at least implemented through three abovementioned working phases.

It should be noted that, in one embodiment, FIG. 3 is a drive sequence schematic that both the first transistor T1 and the second transistor T2 may only be N-type transistors. The N-type transistors may be conducting under the control of a high level signal and may be cutoff under the control of a low level signal. In some optional embodiments, both the first transistor T1 and the second transistor T2 may be P-type transistors. The P-type transistors may be conducting under the control of the low level signal and may be cutoff under the control of the high level signal, so the corresponding drive sequence in one embodiment may change accordingly and details may not be described herein.

It should be further noted that, in the second time period t2, the first signal input terminal 201 may input the low potential signal to the gate of the first transistor T1 and the second signal input terminal 202 may continue to input the high potential signal to the gate of the second transistor T2, so the time that the second signal input terminal 202 maintains the high potential signal may be longer than the time that the first signal input terminal 201 maintains the high potential signal shown in FIG. 3. Optionally, the time that the second signal input terminal 202 maintains the high potential signal may be twice the time that the first signal input terminal 201 maintains the high potential signal.

Figure 6:
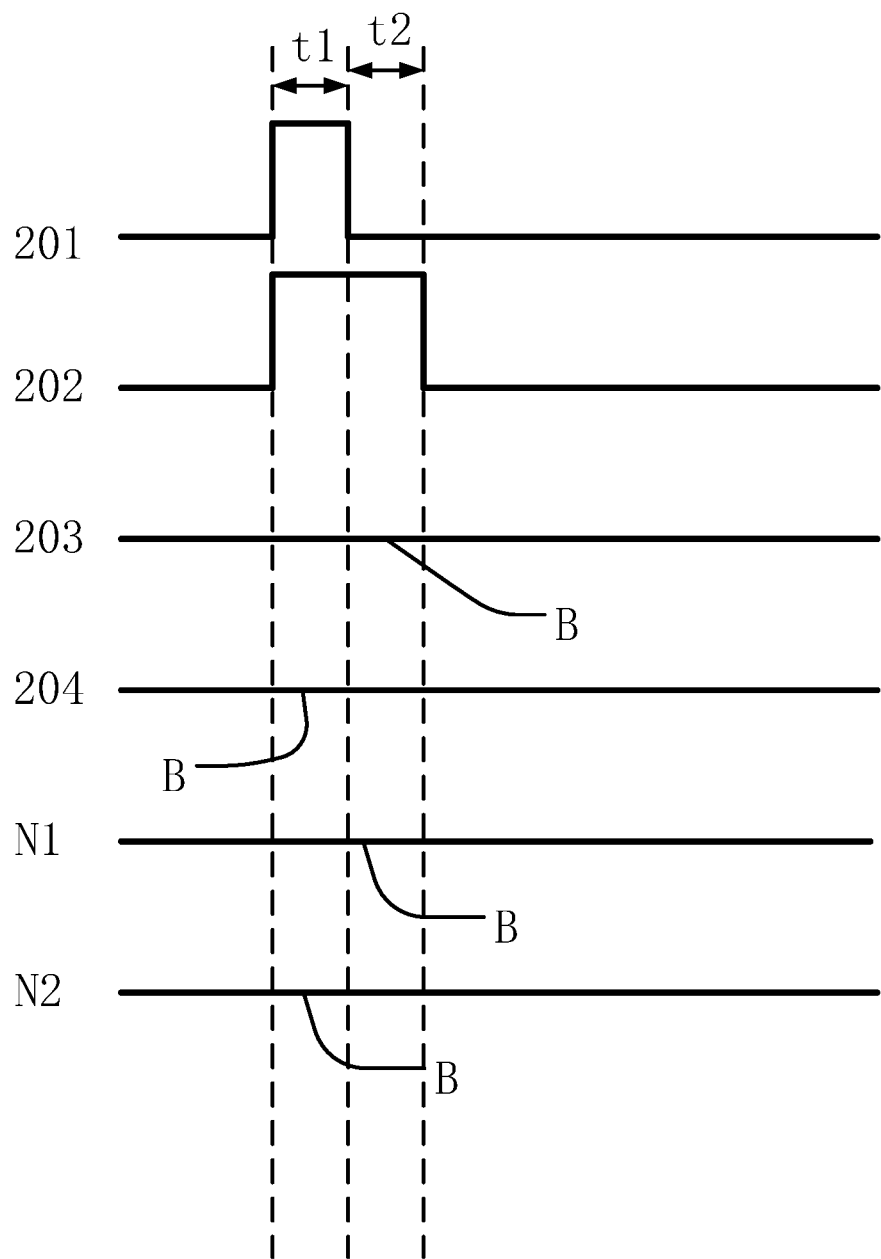
FIG. 6 illustrates a drive sequence schematic corresponding to a low potential signal outputted by the drive circuit provided in FIG. 2.
Figure 7:
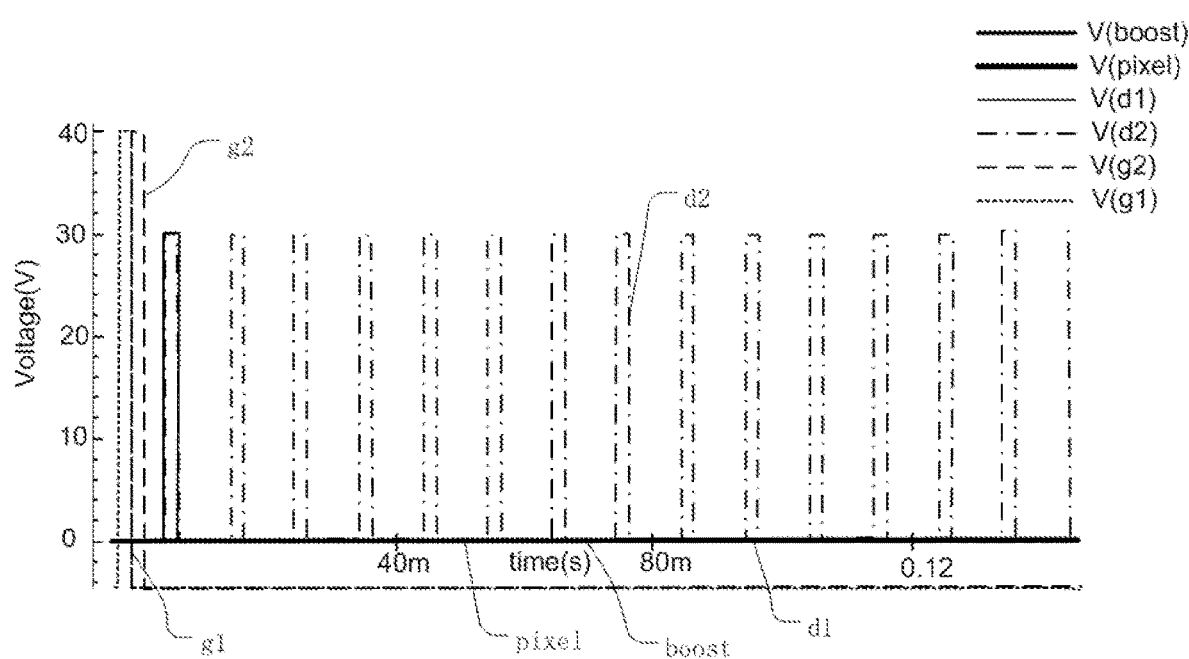
FIG. 7 illustrates a simulation result schematic implemented by the drive sequence of FIG. 6 and the simulation circuit of FIG. 4.

In some optional embodiments, refer to FIG. 2, FIG. 6 and FIG. 7. FIG. 6 illustrates a drive sequence schematic corresponding to a low potential signal outputted by the drive circuit provided in FIG. 2. FIG. 7 illustrates a simulation result schematic implemented by the drive sequence of FIG. 6 and the simulation circuit of FIG. 4. It should be noted that, in order to facilitate the simulation, an overtime treatment may be performed on d1 and d2 having supplied signals in FIG. 5. It can be understood that the working phase of d1 and d2 may be only the phase that g1 and g2 have signals supplied. For example, in the first time period t1 and the second time period t2 in one embodiment, the first node N1 (i.e., the first electrode of the first capacitor C1) may continue to output the low potential signal when both the third signal input terminal 203 and the fourth signal input terminal 204 transmit the low potential signal. It can be seen from the above-mentioned embodiments that the drive circuit in one embodiment may implement the function of low voltage input and high voltage output and the function of low voltage input and low voltage output by changing the drive sequence, and only the input signals of the third signal input terminal 203 and the fourth signal input terminal 204 may be required to be changed. In one embodiment, the circuit structure may be simple. When outputting different high or low potential signals, it may not be required to change the circuit structure and may be only required to adjust the drive sequence, which may be advantageous for the simplification development of the drive work.

Figure 8:
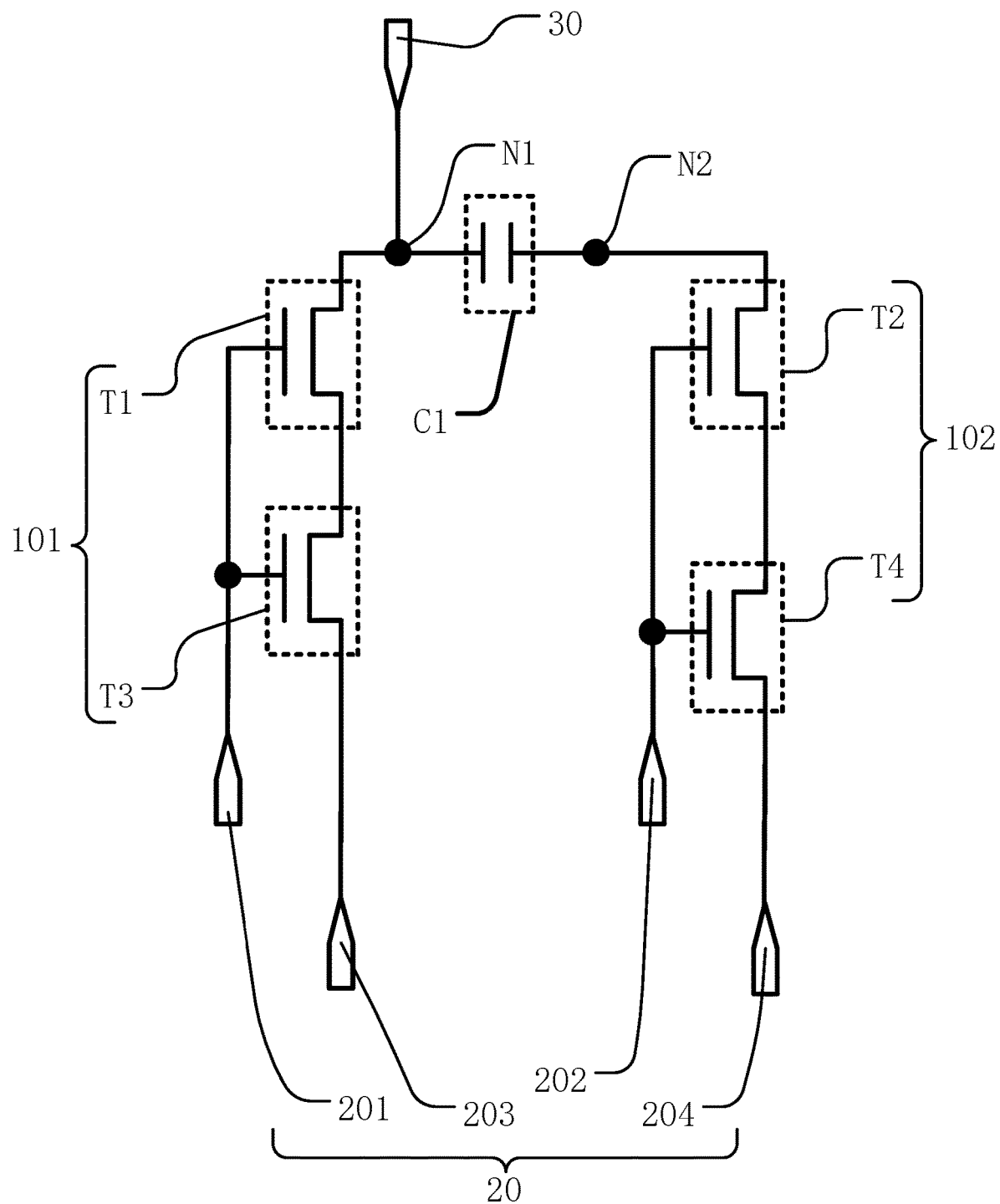
FIG. 8 illustrates a structural schematic of another exemplary drive circuit according to embodiments of the present disclosure.

In some optional embodiments, referring to FIG. 8, FIG. 8 illustrates a structural schematic of another exemplary drive circuit according to embodiments of the present disclosure. In one embodiment, the first module 101 may further include a third transistor T3. A gate of the third transistor T3 may be electrically connected to the gate of the first transistor T1. A first electrode of the third transistor T3 may be electrically connected to the second electrode of the first transistor T1, and a second electrode of the third transistor T3 may be electrically connected to the third signal input terminal 203.

The second module 102 may further include a fourth transistor T4. A gate of the fourth transistor T4 may be electrically connected to the gate of the second transistor T2. A first electrode of the fourth transistor T4 may be electrically connected to the second electrode of the second transistor T2, and a second electrode of the fourth transistor T4 may be electrically connected to the fourth signal input terminal 204.

In one embodiment, the first module 101 may be further configured to include the third transistor T3 and the second module 102 may be further configured to include the fourth transistor T4. After electrically connecting to the first transistor T1, the third transistor T3 may be electrically connected to the third signal input terminal 203. After electrically connecting to the second transistor T2, the fourth transistor T4 may be electrically connected to the fourth signal input terminal 204. In such way, the third transistor T3 and the first transistor T1, and the fourth transistor T4 and the second transistor T2 may respectively form a dual channel transistor structure. When the third signal input terminal 203 of the drive circuit supplies the potential signal to the first electrode of the first capacitor C1 through the third transistor T3 and the first transistor T1, a current flowing through the first electrode of the third transistor T3 is assumed as I, so a leakage current flowing through the gate of the third transistor T3 may be A % X I. When flowing through the gate of the first transistor T1, the leakage current may be A % X I X A %. If A takes a constant of 10, the leakage current flowing through the gate of the third transistor T3 may be 10% I. When flowing through the gate of the first transistor T1, the leakage current may be 10% X I X10%=1% I. Compared with the gate of only one first transistor T1, the leakage current of the gate with the first transistor T1 and the third transistor T3 may be reduced by 9% I when transmitting to the first electrode of the first capacitor C1. Similarly, the fourth signal input terminal 204 may supply the potential signal to the second electrode of the first capacitor C1 through the fourth transistor T4 and the second transistor T2, which may also reduce the leakage current correspondingly. In one embodiment, the first module 101 may be further configured to include the third transistor T3 and the second module 102 may be further configured to include the fourth transistor T4, which may reduce the leakage current and improve the stability of the output signal of the drive circuit.

Figure 9:
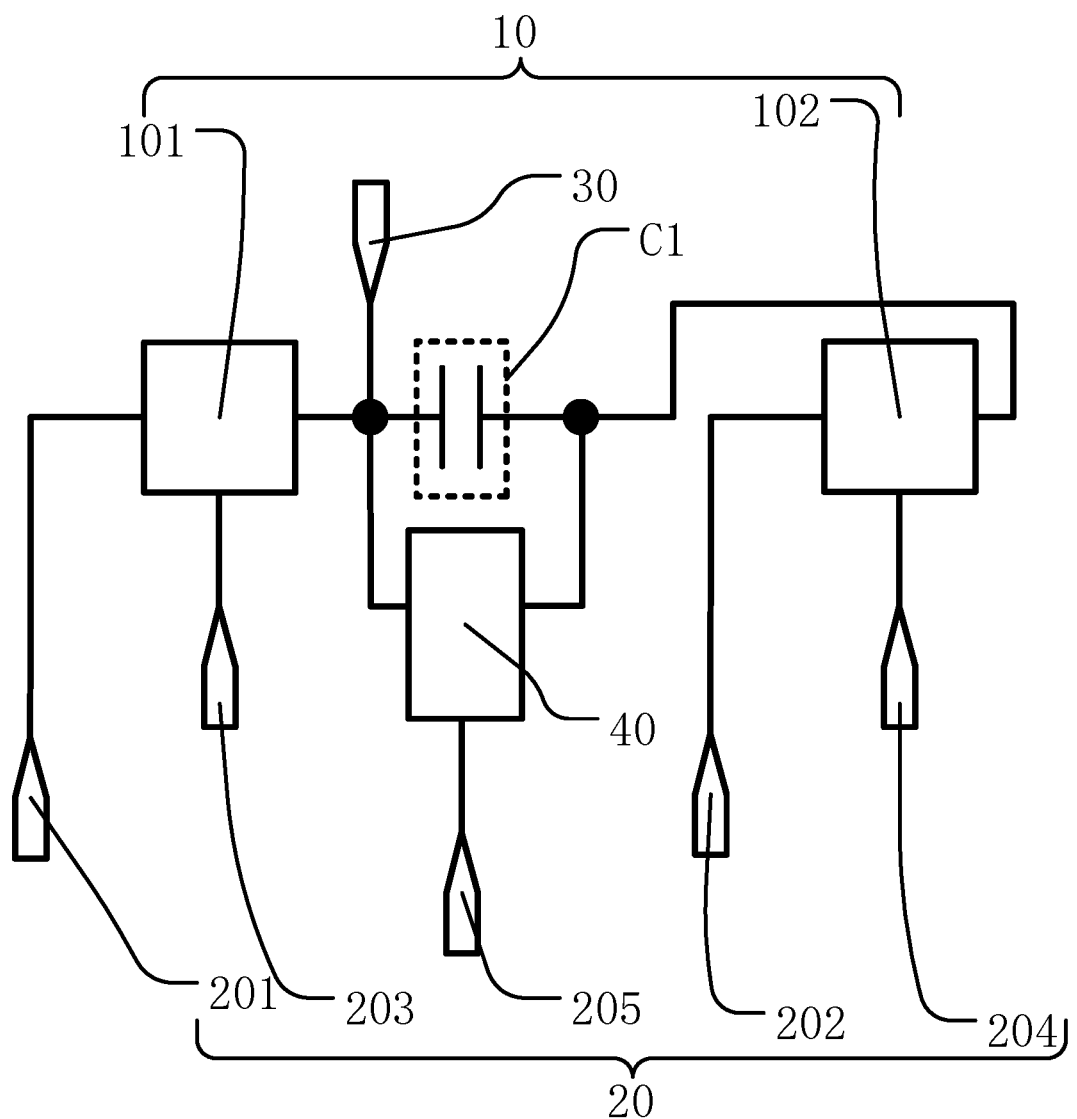
FIG. 9 illustrates a structural schematic of another exemplary drive circuit according to embodiments of the present disclosure.

In some optional embodiments, referring to FIG. 9, FIG. 9 illustrates a structural schematic of another exemplary drive circuit according to embodiments of the present disclosure. In one embodiment, the drive circuit may further include a voltage stabilizing unit 40. The plurality of the signal terminals may further include a fifth signal input terminal 205. The voltage stabilizing unit 40 may be electrically connected to each of the first capacitor C1 and the fifth signal input terminal 205. The voltage stabilizing unit 40 may be used to respectively stabilize the potential signals of the two electrodes of the first capacitor C1.

In one embodiment, it may further describe that the drive circuit may further include the voltage stabilizing unit 40, and the voltage stabilizing unit 40 may be electrically connected to each of the fifth signal input terminal 205 and the two electrodes of the first capacitor C1. The voltage stabilizing unit 40 may be used to respectively stabilize the potential signals of the two electrodes of the first capacitor C1. In such way, after the potential signal of the first electrode of the first capacitor C1 is further increased, the potential signal may be inputted to the two electrodes of the first capacitor C1 through the fifth signal input terminal 205, so the first electrode of the first capacitor C1 may continue to maintain a high potential output, which may increase the high potential retention rate of the drive circuit.

Figure 10:
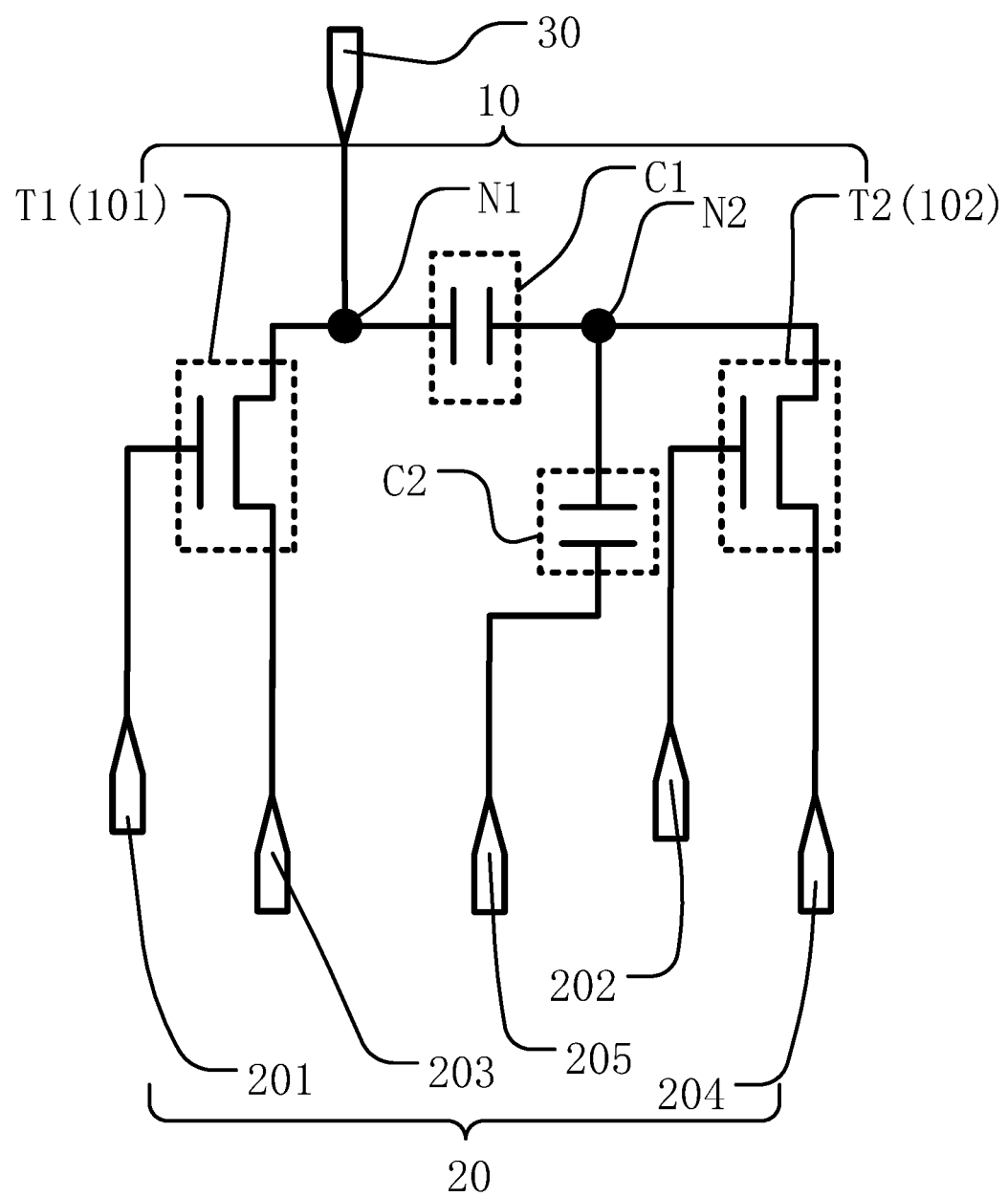
FIG. 10 illustrates a structural schematic of another exemplary drive circuit according to embodiments of the present disclosure.

In some optional embodiments, referring to FIG. 10, FIG. 10 illustrates a structural schematic of another exemplary drive circuit according to embodiments of the present disclosure. In one embodiment, the voltage stabilizing unit 40 may include a second capacitor C2. A first electrode of the second capacitor C2 may be electrically connected to the second electrode of the first capacitor C1, and a second electrode of the second capacitor C2 may be electrically connected to the fifth signal input terminal 205. The second capacitor C2 may be used to stabilize the potential signal of the second electrode of the first capacitor C1.

In one embodiment, it may further describe that the structure of the voltage stabilizing unit 40 of the drive circuit may include the second capacitor C2. The first electrode of the second capacitor C2 may be electrically connected to the second electrode of the first capacitor C1, and the second electrode of the second capacitor C2 may be electrically connected to the fifth signal input terminal 205. The voltage stabilizing potential signal may be transmitted to the second electrode of the second capacitor C2 through the fifth signal input terminal 205. A certain potential difference may be needed to be maintained between the two electrodes of the second capacitor C2, so the first electrode of the second capacitor C2 (i.e., the second electrode of the first capacitor C1) may be maintained at the low potential signal for a period of time. In one embodiment, the second capacitor C2 may be used to stabilize the low potential signal of the second electrode of the first capacitor C1, and signal distortion may be prevented by maintaining the stable low potential signal of the second electrode of the first capacitor C1 through the second capacitor C2.

Figure 11:
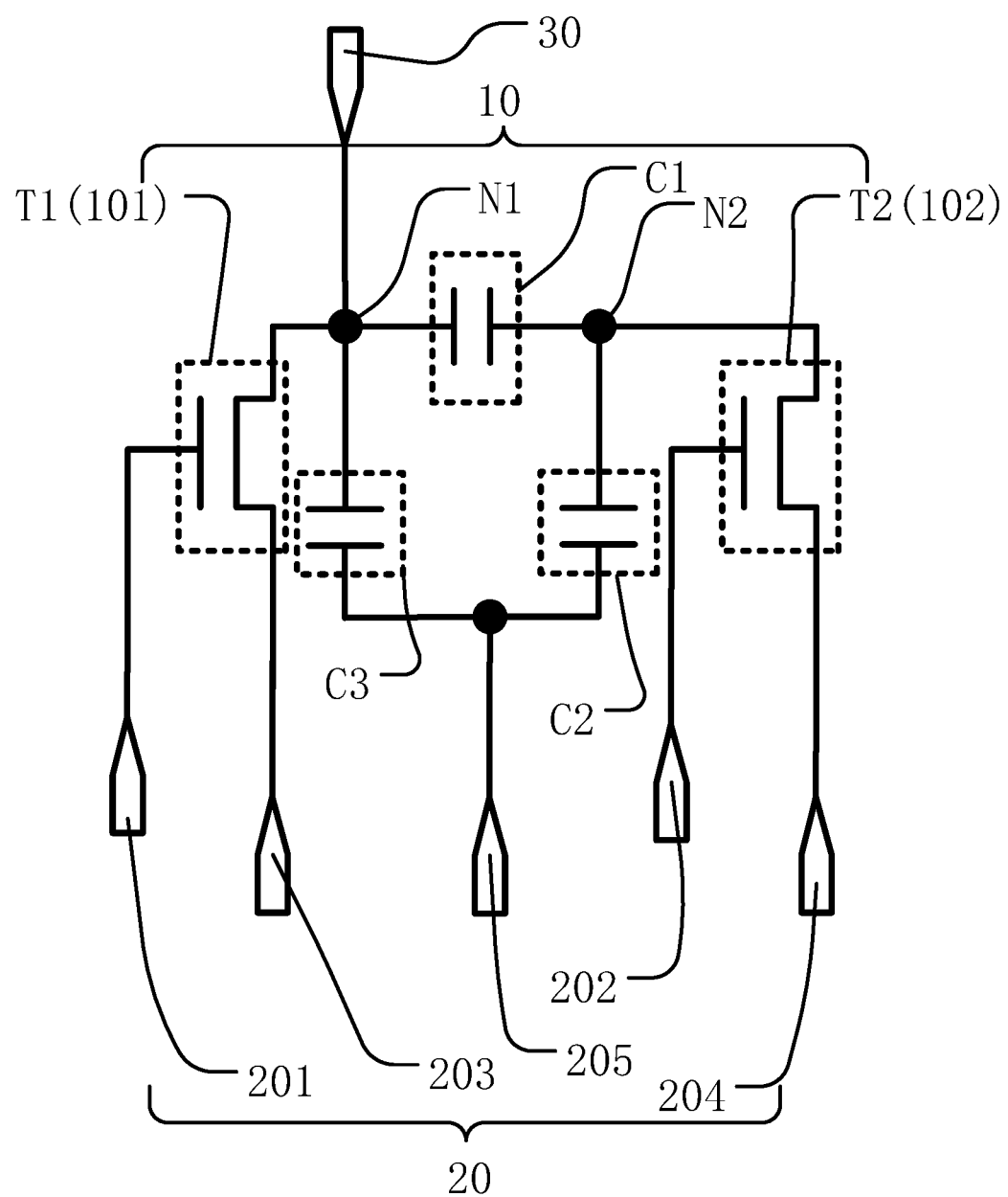
FIG. 11 illustrates a structural schematic of another exemplary drive circuit according to embodiments of the present disclosure.

In some optional embodiments, referring to FIG. 11, FIG. 11 illustrates a structural schematic of another exemplary drive circuit according to embodiments of the present disclosure. In one embodiment, the voltage stabilizing unit 40 may further include a third capacitor C3. A first electrode of the third capacitor C3 may be electrically connected to the first electrode of the first capacitor C1, and a second electrode of the third capacitor C3 may be electrically connected to the fifth signal input terminal 205. The third capacitor C3 may be used to stabilize the potential signal of the first electrode of the first capacitor C1.

In one embodiment, it may further describe that the structure of the voltage stabilizing unit 40 of the drive circuit may include the third capacitor C3 in addition to the second capacitor C2. The first electrode of the third capacitor C3 may be electrically connected to the first electrode of the first capacitor C1, and the second electrode of the third capacitor C3 may be electrically connected to the fifth signal input terminal 205. The voltage stabilizing potential signal may be transmitted to the second electrode of the third capacitor C3 through the fifth signal input terminal 205. A certain potential difference may be needed to be maintained between the two electrodes of the third capacitor C3, so the first electrode of the third capacitor C3 (i.e., the first electrode of the first capacitor C1) may be maintained on the high potential signal for a period of time. In one embodiment, the third capacitor C3 may be configured to stabilize the high potential signal of the first electrode of the first capacitor C1, and signal distortion may be prevented by maintaining the stable high potential signal of the first electrode of the first capacitor C1 through the third capacitor C3.

Figure 12:
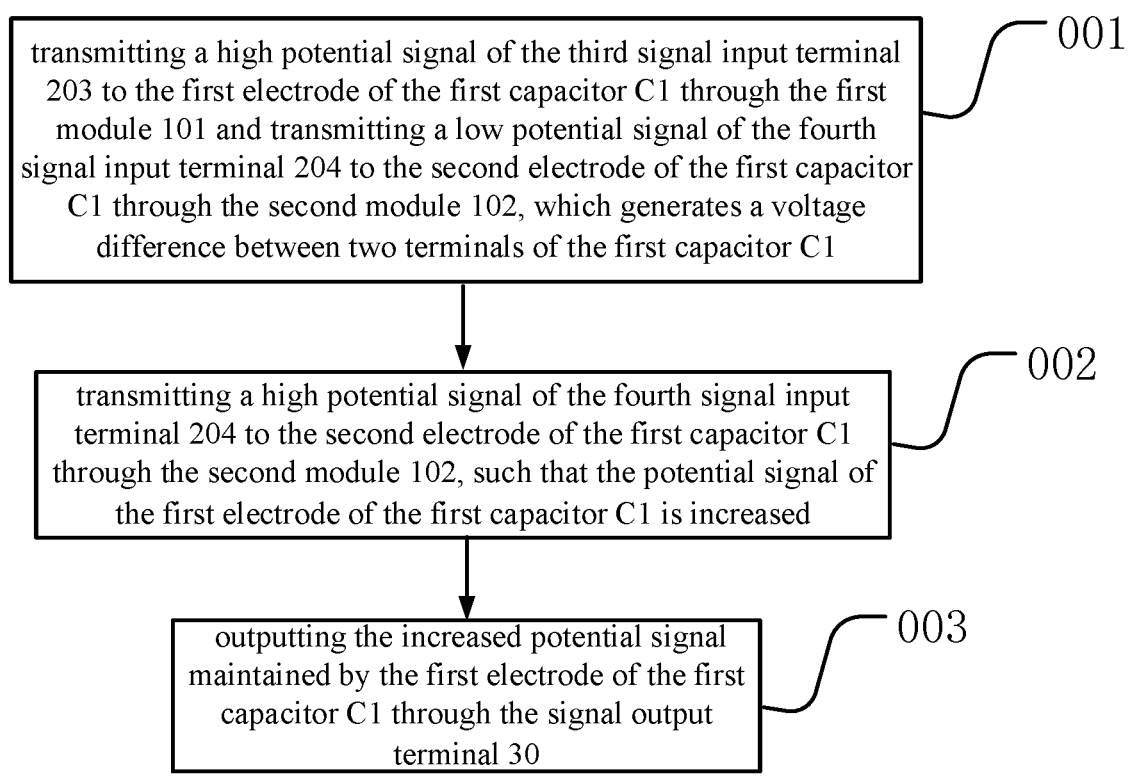
FIG. 12 illustrates a work flowchart of a drive method of a drive circuit according embodiments of the present disclosure.

In some optional embodiments, referring to FIG. 12, FIG. 12 illustrates a work flowchart of a drive method of a drive circuit according embodiments of the present disclosure. In one embodiment, the drive method of the drive circuit may be used to drive the drive circuit according to the embodiments of the present disclosure. The drive method may include:

a first phase 001, where the high potential signal of the third signal input terminal 203 may be transmitted to the first electrode of the first capacitor C1 through the first module 101; the low potential signal of the fourth signal input terminal 204 may be transmitted to the second electrode of the first capacitor C1 through the second module 102, which may generate a voltage difference between the two electrodes of the first capacitor C1;

a second phase 002, where the high potential signal of the fourth signal input terminal 204 may be transmitted to the second electrode of the first capacitor C1 through the second module 102, so the potential signal of the first electrode of the first capacitor C1 may be increased; and a third phase 003, where the increased potential signal maintained by the first electrode of the first capacitor C1 may be outputted through the signal output terminal 30.

In one embodiment, it may further describe the drive method of the drive circuit according to the embodiments of the present disclosure. The drive method may at least include three working phases. In the first phase 001, the first module 101 and the second module 102 may operate, which may transmit the high potential signal of the third signal input terminal 203 to the first electrode of the first capacitor C1 through the first module 101, and may transmit the low potential signal of the fourth signal input terminal 204 to the second electrode of the first capacitor C1 through the second module 102, which may generate the voltage difference between the two electrodes of the first capacitor C1. In the second phase 002, the first module 101 may not operate and the second module 102 may continue to operate, which may transmit the high potential signal of the fourth signal input terminal 204 to the second electrode of the first capacitor C1 through the second module 102. Currently, the first module 101 may not operate, and the first capacitor C1 may be subject to the coupling effect where the voltage difference between the two electrodes of the first capacitor C1 may remain unchanged; and the high potential signal of the fourth signal input terminal 204 may be transmitted to the second electrode of the first capacitor C1 through the second module 102. Therefore, the potential signal of the first electrode of the first capacitor C1 may be further increased. In the third phase 003, the increased potential signal maintained by the first electrode of the first capacitor C1 may be outputted through the signal output terminal 30.

In the drive method of one embodiment, the input signals of the first signal input terminal 201 and the second signal input terminal 202 may control the conduction of the first module 101 and the second module 102 at the first phase 001, and may control the turn-off of the first module 101 and conduction of the second module 102 at the second phase 002, and may respectively transmit the signals of the third signal input terminal 203 and the fourth signal input terminal 204 to the two electrodes of the first capacitor C1 in the two phases. Therefore, after forming the voltage difference between the first electrode and the second electrode of the first capacitor C1, the potential signal of the first electrode of the first capacitor C1 may be further increased to obtain a higher potential signal, thereby implementing the function of low voltage input and high voltage output of the drive circuit, which may be advantageous to implement the step-up drive method.

In some optional embodiments, refer to FIG. 2, FIG. 3 and FIG. 12. In one embodiment, the first module 101 may include the first transistor T1. The gate of the first transistor T1 may be electrically connected to the first signal input terminal 201. The first electrode of the first transistor T1 may be electrically connected to the first electrode of the first capacitor C1, and the second electrode of the first transistor T1 may be electrically connected to the third signal input terminal 203.

The second module 102 may include the second transistor T2. The gate of the second transistor T2 may be electrically connected to the second signal input terminal 202. The first electrode of the second transistor T2 may be electrically connected to the second electrode of the first capacitor C1, and the second electrode of the second transistor T2 may be electrically connected to the fourth signal input terminal 204.

The first node N1 may be configured between the first electrode of the first transistor T1 and the first electrode of the first capacitor C1. The second node N2 may be configured between the second electrode of the first capacitor C1 and the first electrode of the second transistor T2. The first node N1 may be electrically connected to the signal output terminal 30.

In a first phase 001, both the first transistor T1 and the second transistor T2 may be conducting. The high potential signal A of the third signal input terminal 203 may be transmitted to the first node N1 through the first transistor T1, and the low potential signal B of the fourth signal input terminal 204 may be transmitted to the second node N2 through the second transistor T2, where A is greater than B. The voltage difference between the two electrodes of the first capacitor C1 may be a difference (A−B) between the potential of the first node N1 and the potential of the second node N2.

In a second phase 002, the first transistor T1 may be cutoff, and the second transistor T2 may continue to be conducting. At this time, the high potential signal A of the fourth signal input terminal 204 may be transmitted to the second node N2 through the second transistor T2, and the potential of the second node N2 may be A. The potential of the first node N1 may be increased to (A+(A−B))=(2A−B).

In some optional embodiments, referring to FIG. 9, the drive circuit may further include the voltage stabilizing unit 40. The plurality of the signal input terminals 20 may further include the fifth signal input terminal 205. The voltage stabilizing unit 40 may be electrically connected to each of the first capacitor C1 and the fifth signal input terminal 205 and may respectively stabilize the potential signals of the two electrodes of the first capacitor C1.

Figure 13:
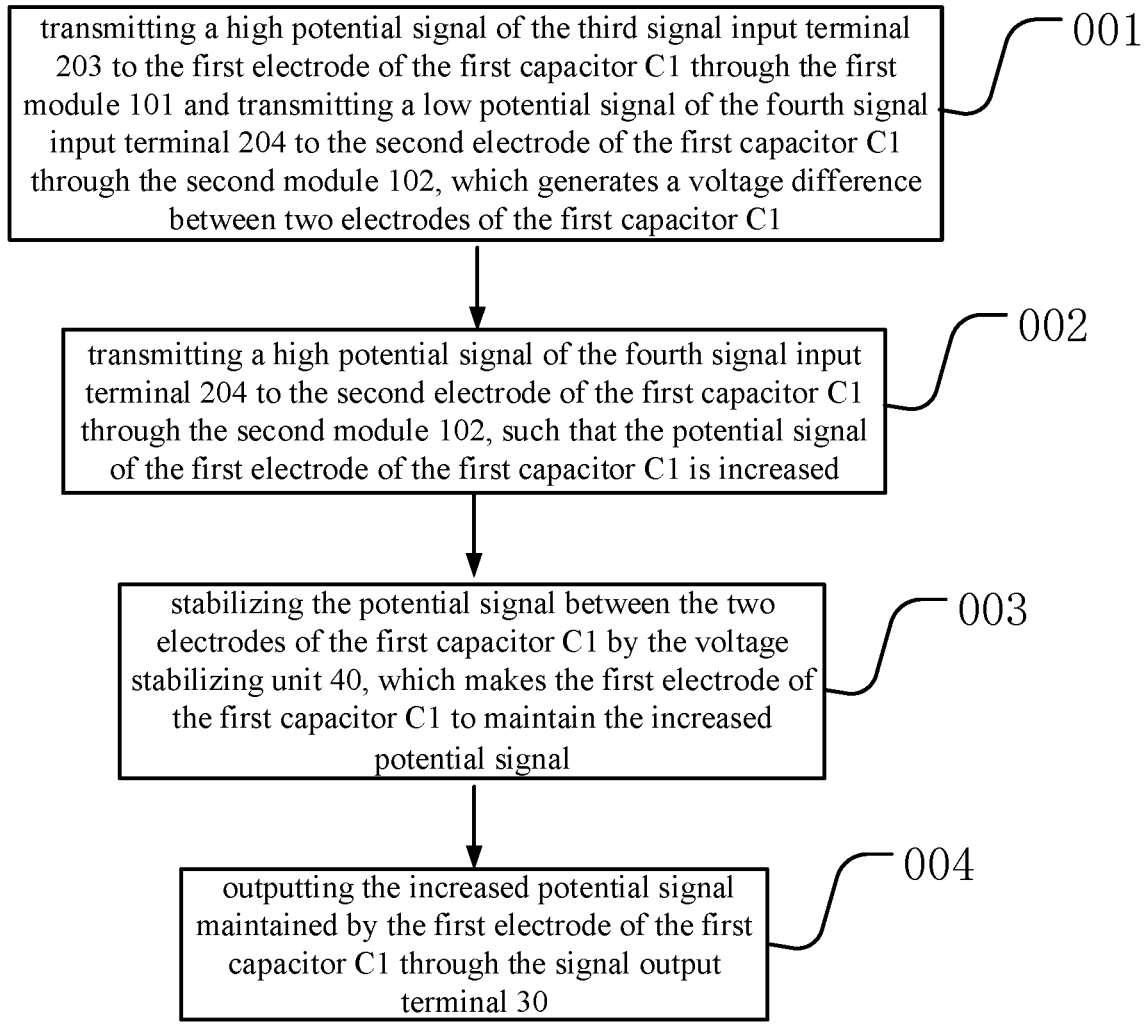
FIG. 13 illustrates another work flowchart of a drive method of a drive circuit according embodiments of the present disclosure.
Figure 14:
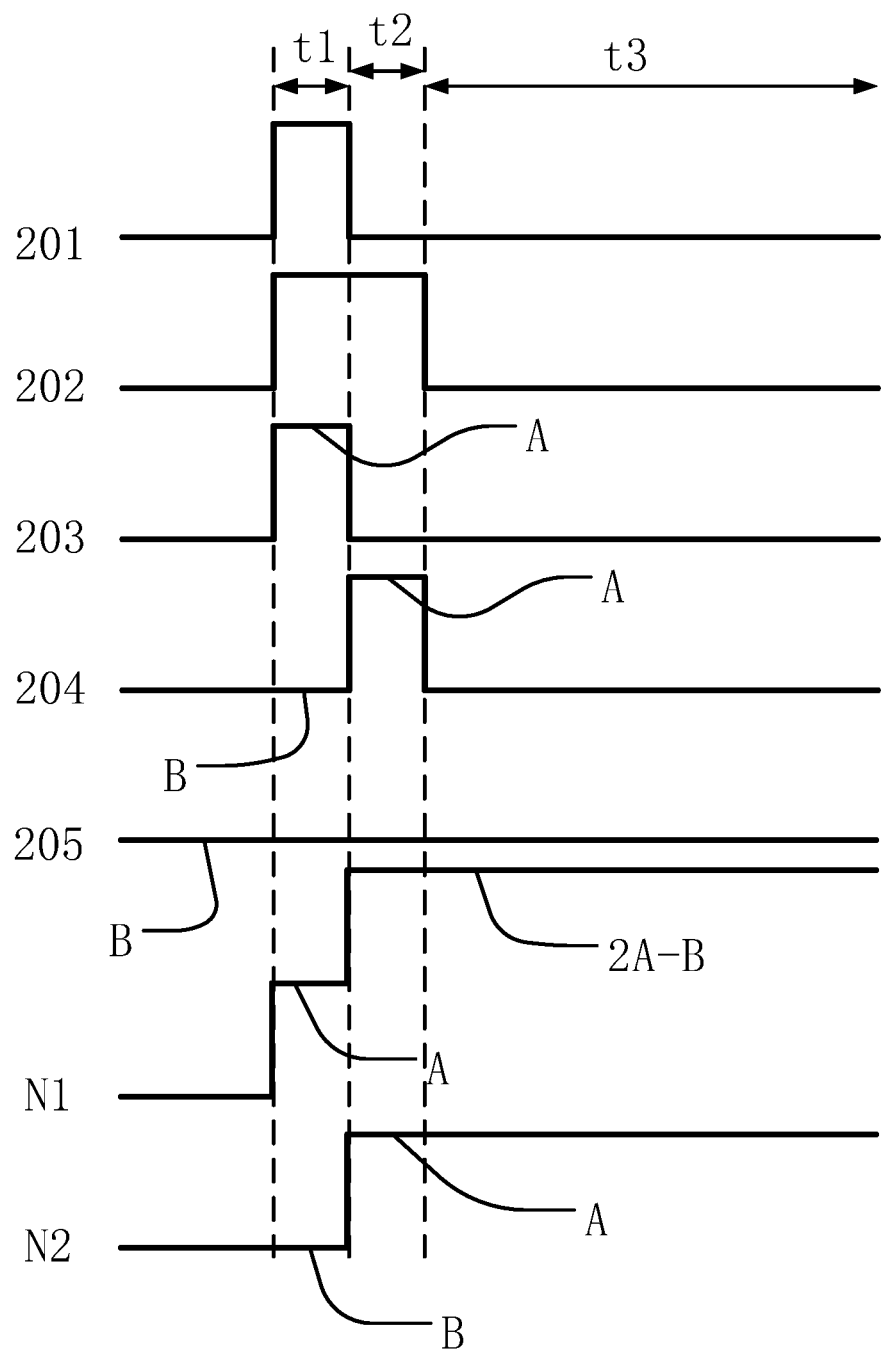
FIG. 14 illustrates a drive sequence schematic corresponding to the drive circuit of FIG. 11 and the drive method of FIG. 13.

In some optional embodiments, referring to FIG. 11, FIG. 13 and FIG. 14, FIG. 13 illustrates another work flowchart of a drive method of a drive circuit according embodiments of the present disclosure. FIG. 14 illustrates a drive sequence schematic corresponding to the drive circuit of FIG. 11 and the drive method of FIG. 13. In one embodiment, the voltage stabilizing unit 40 may include the second capacitor C2 and the third capacitor C3. The first electrode of the second capacitor C2 may be electrically connected to the second electrode of the first capacitor C1, and the second electrode of the second capacitor C2 may be electrically connected to the fifth signal input terminal 205. The first electrode of the third capacitor C3 may be electrically connected to the first electrode of the first capacitor C1, and the second electrode of the third capacitor C3 may be electrically connected to the fifth signal input terminal 205.

The drive method may further include a voltage stabilizing phase 004 between the second phase 002 and the third phase 003. In the voltage stabilizing phase 004, the voltage stabilizing unit 40 may stabilize the potential signal between the two electrodes of the first capacitor C1, which may enable the first electrode of the first capacitor C1 to maintain the increased potential signal.

In the voltage stabilizing phase 004, the low potential signal of the fifth signal input terminal 205 may be transmitted to the second electrode of the second capacitor C2 and the second electrode of the third capacitor C3, which may maintain the stable potential signals of the first electrode of the second capacitor C2 and the first electrode of the third capacitor C3. The voltage difference between the first node N1 and the second node N2 may remain unchanged, that is, the potential of the first node N1 may be maintained to be (2A−B).

In one embodiment, it may further describe that the drive method of the drive circuit may further include the voltage stabilizing phase 004. In the voltage stabilizing phase 004, the voltage stabilizing unit 40 may be electrically connected to each of the fifth signal input terminal 205 and the two electrodes of the first capacitor C1, which may be configured to respectively stabilize the potential signals of the two electrodes of the first capacitor C1. After the potential signal of the first electrode of the first capacitor C1 is further increased, the potential signal may be inputted to the two electrodes of the first capacitor C1 through the fifth signal input terminal 205, so the first electrode of the first capacitor C1 may continue to maintain the high potential output, which may increase the high potential retention rate of the drive circuit.

Figure 15:
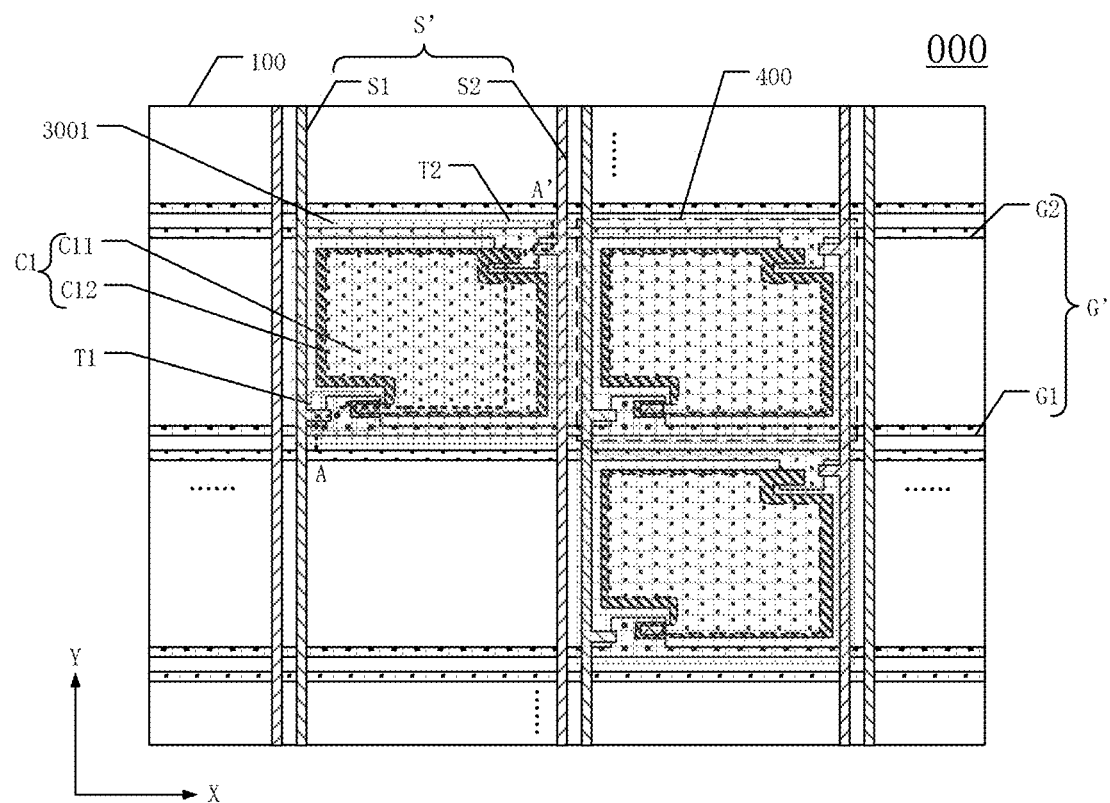
FIG. 15 illustrates a top-view structural schematic of a panel according embodiments of the present disclosure.
Figure 16:
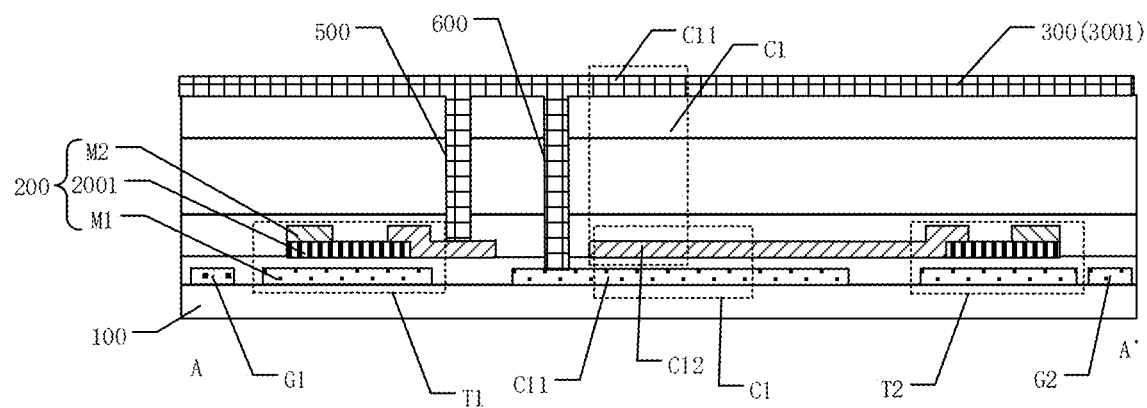
FIG. 16 illustrates a cross-sectional structural schematic along a A-A' direction in FIG. 15.

In some optional embodiments, referring to FIG. 15 and FIG. 16, FIG. 15 illustrates a top-view structural schematic of a panel according embodiments of the present disclosure. In order to illustrate the technical solution of one embodiment, only three drive units 400 may be shown in FIG. 15 for description. A first electrode C11 of the first capacitor C1 may be in a same film layer of the panel and may be on a side of a second electrode C12 of the first capacitor C1 adjacent to a substrate 100 in FIG. 15. However, in order to illustrate other structures of the panel in FIG. 15, the first electrode C11 of the first capacitor C1 may be illustrated by a dashed line box on the top-view schematic, and the actual film layer positions of the panel may be understood in conjunction with FIG. 16. FIG. 16 illustrates a cross-sectional structural schematic along a A-A' direction in FIG. 15. In one embodiment, a panel 000 may include the substrate 100 (not filled in FIG. 16), an array layer 200, and an electrode array layer 300. The array layer 200 may be on a side of the substrate 100. The electrode array layer 300 may be on a side of the array layer 200 away from the substrate 100. The array layer 200 may include an active layer 2001, a gate metal layer M1 and a source/drain metal layer M2.

The substrate 100 may include a plurality of drive units 400 arranged in an array, a plurality of scan line groups G', and a plurality of data line groups S'.

The scan line groups G' may include first scan lines G1 and second scan lines G2 adjacent to the first scan lines G1 extending in a first direction X. The data line groups S' may include first data lines S1 and second data lines S2 adjacent to the first data lines S1 extending in a second direction Y; where the first direction X may be perpendicular with the second direction Y.

The electrode array layer 300 may include a plurality of drive electrodes 3001 arranged in an array. The drive electrodes 3001 may correspond to the drive units 400. The drive unit 400 may include the first transistor T1, the second transistor T2 and the first capacitor C1.

The gate of the first transistor T1 may be electrically connected to the first scan line G1. The source of the first transistor T1 may be electrically connected to the first data line S1. The drain of the first transistor T1 may be electrically connected to the drive electrode 3001. The drive electrodes 3001 may be electrically connected to the first electrode C11 of the first capacitor C1.

The gate of the second transistor T2 may be electrically connected to the second scan line G2. The source of the second transistor T2 may be electrically connected to the second data line S2. The drain of the second transistor T2 may be electrically connected to the second electrode C12 of the first capacitor C1.

Optionally, in the second direction Y, the first scan line G1 and the second scan line G2 of the scan line group G' may be on both sides of the drive electrode 3001. In the first direction X, the first data line S1 and the second data line S2 of the data line group S' may be on both sides of the drive electrode 3001. Optionally, the drive electrodes 3001 may be made of a material including indium tin oxide. Both the first electrode C11 and the second electrode C12 of the first capacitor C1 may be made of metal materials.

The structure of the panel 000 may be provided in one embodiment. The electrode array layer 300 of the panel 000 may include the plurality of the drive electrodes 3001 arranged in an array. The drive electrodes 3001 may correspond to the drive units 400. The drive unit 400 may include the first transistor T1, the second transistor T2 and the first capacitor C1. The gate of the first transistor T1 may be electrically connected to the first scan line G1, which may be configured to control the conduction and cutoff of the first transistor T1 through the scan signal supplied by the first scan line G1. The gate of the second transistor T2 may be electrically connected to the second scan line G2, which may be configured to control the conduction and cutoff of the second transistor T2 through the scan signal supplied by the second scan line G2. The source of the first transistor T1 may be electrically connected to the first data line S1, and the drain of the first transistor T1 may be electrically connected to the drive electrode 3001, which may be configured to transmit the data signal of the first signal line S1 to the drive electrode 3001 when the first transistor T1 is conducting. The source of the second transistor T2 may be electrically connected to the second data line S2, and the drain of the second transistor T2 may be electrically connected to the second electrode C12 of the first capacitor C1, which may be configured to transmit the data signal of the second signal line S2 to the second electrode C12 of the first capacitor C1 when the second transistor T2 is conducting. The first electrode C11 of the first capacitor C1 may be electrically connected to the drive electrode 3001, that is, the first electrode C11 of the first capacitor C1 and the drive electrode 3001 may have the same potential signal.

In one embodiment, both the first transistor T1 and the second transistor T2 may be N-type transistors, which may be used as an example for description. First, the high potential signal of the first scan line G1 may be transmitted to the gate of the first transistor T1 and the high potential signal of the second scan line G2 may be transmitted to the gate of the second transistor T2, so the first transistor T1 and the second transistor T2 may be conducting. The high potential signal of the first data line S1 may be transmitted to the drive electrode 3001 (i.e., the first electrode C11 of the first capacitor C1) through the source and drain of the first transistor T1, and the low potential signal of the second data line S2 may be transmitted to the second electrode C12 of the first capacitor C1 through the source and drain of the second transistor T2. The voltage difference between the both electrodes of the first capacitor C1 may be a difference between the potential of the drive electrode 3001 and the potential of the second electrode C12 of the first capacitor C1.

Then, the low potential signal of the first scan line G1 may be transmitted to the gate of the first transistor T1 and the high potential signal of the second scan line G2 may be transmitted to the gate of the second transistor T2, so the first transistor T1 may be cutoff and the second transistor T2 may be conducting. The high potential signal of the second data line S2 may be transmitted to the second electrode C12 of the first capacitor C1 through the source and drain of the second transistor T2. Currently, the first transistor T1 may be cutoff and the first capacitor C1 may be subject to the coupling effect where the voltage difference between two electrodes of the first capacitor C1 may remain unchanged, so the potential (i.e., the potential of the drive electrode 3001) of the first electrode C11 of the first capacitor C1 may be further increased, thereby implementing the low voltage input and high voltage output function of the drive unit 400 of the panel 000, and improving the drive capability of the panel 000.

It should be noted that, in one embodiment, only the film layer structure of the panel 000 related to the technical content of the present disclosure may be illustrated in FIG. 16 for description, which may not be limited to the film layer structure. Other film layers such as an insulation layer, a flat layer, etc. may be included in FIG. 16, which may not be described in detail herein. Those skilled in the art may understand the panel structure of the present disclosure according to the film layer structure of the existing panel. In one embodiment, the electrode array layer 300 may be made of a transparent conductive material, such as indium tin oxide (ITO) semiconductor transparent conductive material, and also be made of other transparent conductive materials which may not be limited in the embodiments of the present disclosure.

In some optional embodiments, referring to FIG. 15 and FIG. 16, the first scan line G1 and the second scan line G2 of one scan line group G' may be respectively between two adjacent drive units 400 in the second direction Y.

The first data line S1 and the second data line S2 of one data line group S' may be respectively between two adjacent drive units 400 in the first direction X.

One first scan line G1 and one second scan line G2 on the both sides of the drive unit 400 in the second direction Y, and one first data line S1 and one second data line S2 on the both sides of the drive unit 400 in the first direction X may insulatively intersect to define the region for the drive unit 400.

In one embodiment, it may further describe that the relative positional relationship between each drive unit 400 on the panel 000 and each of the scan line group G' and the data line group S'. In such way, the scan line group G' and the data line group S' may provide different drive signals, which may enable the reasonable arrangement of the structure of the panel 000 and better implement the drive function of the drive unit 400 in one embodiment.

In some optional embodiments, referring to FIG. 15 and FIG. 16, the drain of the first transistor T1 may be electrically connected to the drive electrode 3001 through a first via 500, and the drive electrode 3001 may be electrically connected to the first electrode C11 of the first capacitor C1 through a second via 600.

In one embodiment, the drain of the first transistor T1 may be electrically connected to the drive electrode 3001 through the first via 500, and the drive electrode 3001 may be electrically connected to the first electrode C11 of the first capacitor C1 through the second via 600. The drive voltage of the drive electrode 3001 may be provided by the drain of the first transistor T1 and the first electrode C11 of the first capacitor C1, which may implement the step-up effect of the low voltage input and high voltage output of the drive unit 400.

In some optional embodiments, referring to FIG. 15 and FIG. 16, the scan line group G', the gate of the first transistor T1 and the gate of the second transistor T2 may all in the gate metal layer M1. The data line group S', the source and drain of the first transistor T1, and the source and drain of the second transistor T2 may all in the source/drain metal layer M2.

The first electrode C11 of the first capacitor C1 may be in the gate metal layer M1 and the electrode array layer 300, and the second electrode C12 of the first capacitor C1 may be in the source/drain metal layer M2.

In one embodiment, it may further describe that the film layer of each structure of the drive unit 400 located on the panel. Therefore, the first capacitor C1 may be formed by overlapping the gate metal layer M1 and the source/drain metal layer M2, and by overlapping the source/drain metal layer M2 and the electrode array layer 300, which may effectively improve the capacitance of the first capacitor C1.

It should be noted that, in one embodiment, the drain of the first transistor T1 and the second electrode C12 of the first capacitor C1 may be both in the source/drain metal layer M2. However, the drain of the first transistor T1 may be electrically connected to the drive electrode 3001 through the first via 500, and the drive electrode 3001 may be electrically connected to the first electrode C11 of the first capacitor C1 through the second via 600. Therefore, in order to form the first capacitor C1 by overlapping the gate metal layer M1 and the source/drain metal layer M2 and by overlapping the source/drain metal layer M2 and the electrode array layer 300, the drain of the first transistor T1 and the second electrode C12 of the first capacitor C1 may be two separate structures (as shown in FIG. 16).

Figure 17:
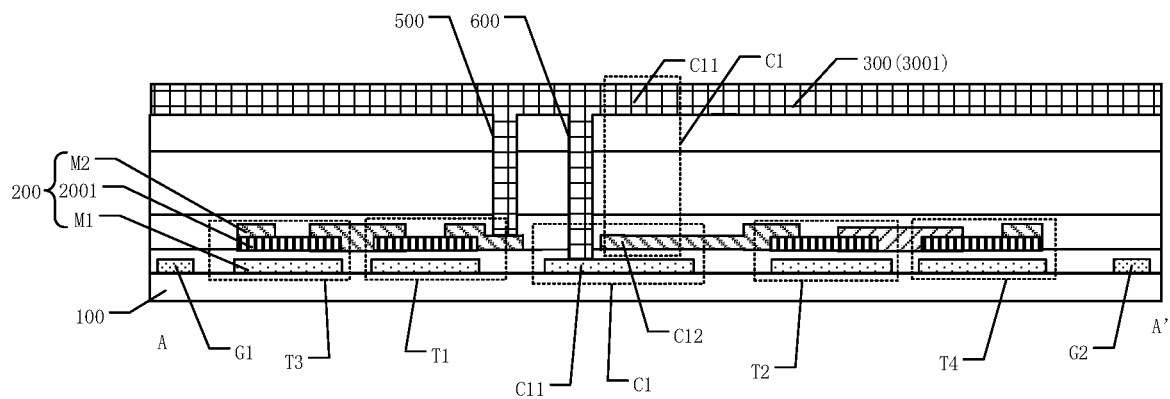
FIG. 17 illustrates another cross-sectional structural schematic along a A-A' direction in FIG. 15.

In some optional embodiments, referring to FIG. 15 and FIG. 17, FIG. 17 illustrates another cross-sectional structural schematic along a A-A' direction in FIG. 15. In one embodiment, the drive unit 400 may further include the third transistor T3 and the fourth transistor T4. The gate of the third transistor T3 may be electrically connected to the gate of the first transistor T1. The drain of the third transistor T3 may be electrically connected to the source of the first transistor T1. The source of the third transistor T3 may be electrically connected to the third signal input terminal 203. The gate of the fourth transistor T4 may be electrically connected to the gate of the second transistor T2. The drain of the fourth transistor T4 may be electrically connected to the source of the second transistor T2. The source of the fourth transistor T4 may be electrically connected to the fourth signal input terminal 204.

The gate of the third transistor T3 and the gate of the fourth transistor T4 may both in the gate metal layer M1. The source and drain of the third transistor T3, and the source and drain of the fourth transistor T4 may all in the source/drain metal layer M2.

The drain of the third transistor T3 and the source of the first transistor T1 may be formed into an integrated structure, and the drain of the fourth transistor T4 and the source of the second transistor T2 may be formed into an integrated structure.

In one embodiment, it may further describe that the first transistor T1 of the drive unit 400 may be electrically connected to the third transistor T3, and the second transistor T2 may be electrically connected to the fourth transistor T4. The drain of the third transistor T3 and the source of the first transistor T1 may be formed into an integrated structure, and the drain of the fourth transistor T4 and the source of the second transistor T2 may be formed into an integrated structure. Therefore, the first transistor T1 and the third transistor T3 may form a switch transistor with a double channel structure, and the second transistor T2 and the fourth transistor T4 may also form a switch transistor with a double channel structure. When the first data line S1 of the drive unit 400 supplies the potential signal to the first electrode C11 of the first capacitor C1 through the first transistor T1 and the third transistor T3, a current flowing through the third transistor T3 is assumed as I, so a leakage current flowing through the gate of the third transistor T3 may be A % X I. When flowing through the gate of the first transistor T1, the leakage current may be A % X I X A %. If A takes a constant of 10, the leakage current flowing through the gate of the third transistor T3 may be 10% I. When flowing through the gate of the first transistor T1, the leakage current may be 10% X I X10%=1% I. Compared with the gate with only one first transistor T1, the leakage current of the gate with the first transistor T1 and the third transistor T3 may be reduced by 9% I when transmitting to the first electrode C11 of the first capacitor C1. Similarly, the second data line S2 may supply the potential signal to the second electrode C12 of the first capacitor C1 through the fourth transistor T4 and the second transistor T2, which may also reduce the leakage current correspondingly. In one embodiment, the second transistor T2 of the drive unit 400 may be electrically connected to the fourth transistor T4, and the first transistor T1 may be electrically connected to the third transistor T3. The drain of the third transistor T3 and the source of the first transistor T1 may be formed into an integrated structure, and the drain of the fourth transistor T4 and the source of the second transistor T2 may be formed into an integrated structure, which may reduce the leakage current and improve the stability of the output signal of the drive unit 400.

Figure 18:
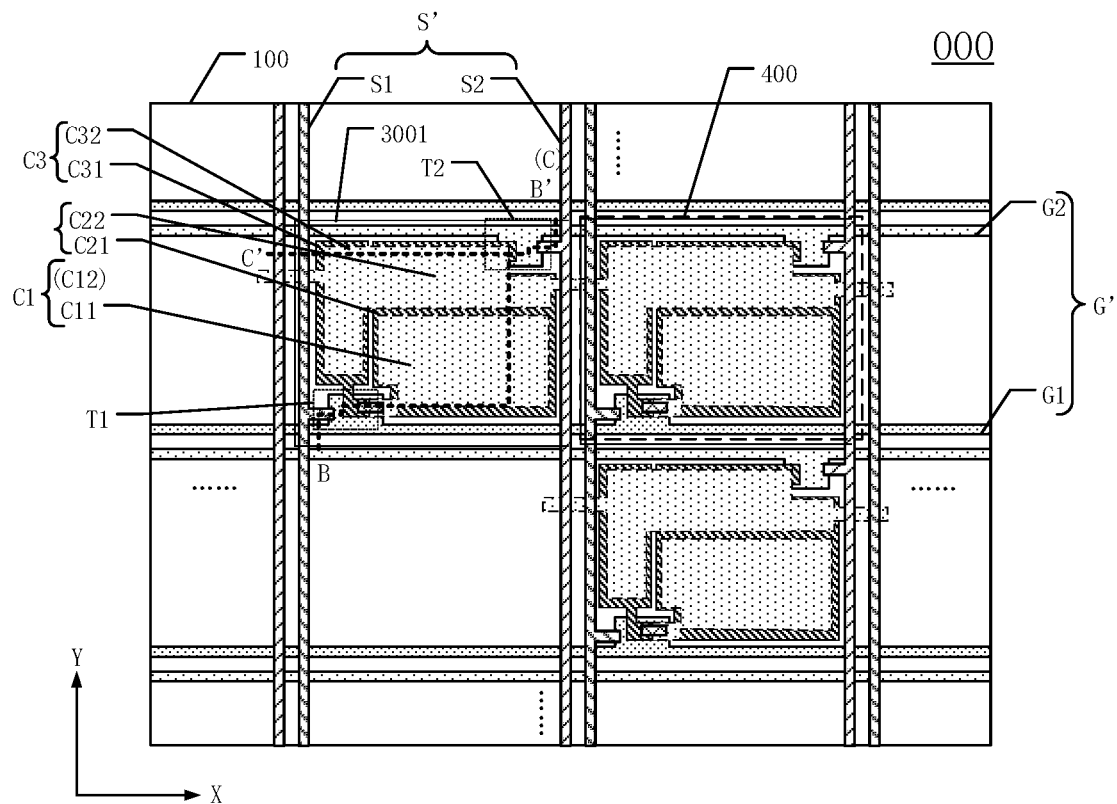
FIG. 18 illustrates another top-view structural schematic of a panel according embodiments of the present disclosure.
Figure 19:
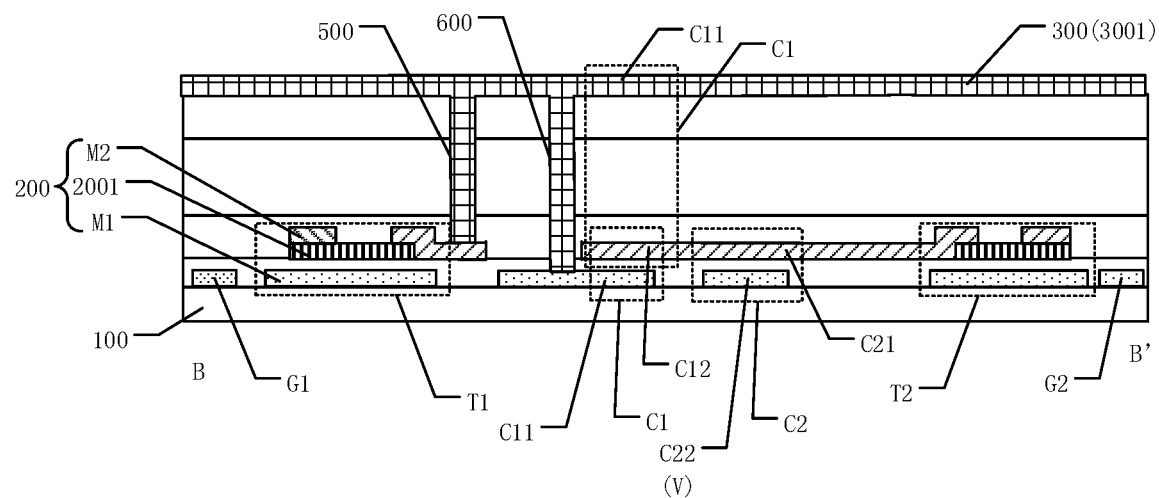
FIG. 19 illustrates a cross-sectional structural schematic along a B-B' direction in FIG. 18.
Figure 20:
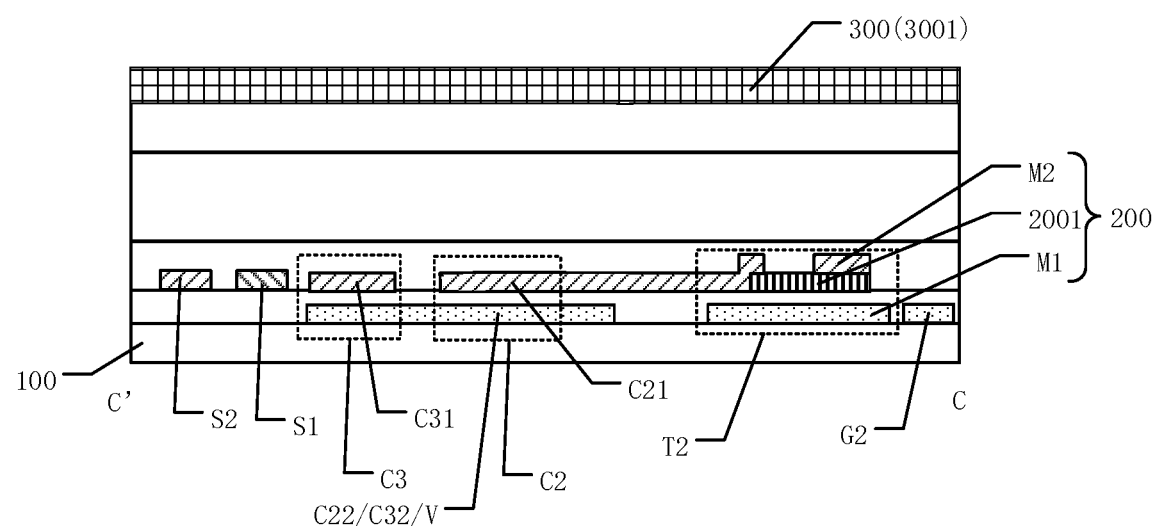
FIG. 20 illustrates a cross-sectional structural schematic along a C-C' direction in FIG. 18.

In some optional embodiments, referring to FIG. 18, FIG. 19 and FIG. 20, FIG. 18 illustrates another top-view structural schematic of a panel according embodiments of the present disclosure. In order to illustrate the technical solution of one embodiment, only three drive units 400 may be shown in FIG. 18 for description. The first electrode C11 of the first capacitor C1, the second electrode C22 of the second capacitor C2 and the second electrode C32 of the third capacitor C3 may be in a same film layer of the panel, and may be on a side of the second electrode C12 of the first capacitor C1, a first electrode C21 of the second capacitor C2 and a first electrode C31 of the third capacitor C3, which are adjacent to the substrate 100. However, in order to illustrate other structures of the panel in FIG. 18, the first electrode C11 of the first capacitor C1, the second electrode C22 of the second capacitor C2 and the second electrode C32 of the third capacitor C3 may be illustrated by a dashed line box on the top-view schematic, and the actual film layer positions of the panel may be understood in conjunction with FIG. 18 and FIG. 19. FIG. 19 illustrates a cross-sectional structural schematic along a B-B' direction in FIG. 18. FIG. 20 illustrates a cross-sectional structural schematic along a C-C' direction in FIG. 18. In one embodiment, the substrate 100 may further include a common signal line V. The drive unit 400 may further include the second capacitor C2 and the third capacitor C3. The first electrode C21 of the second capacitor C2 may be electrically connected to the second electrode C12 of the first capacitor C1, and the second electrode C22 of the second capacitor C2 may be electrically connected to the common signal line V. The first electrode C31 of the third capacitor C3 may be electrically connected to the first electrode C11 of the first capacitor C1, and the second electrode C32 of the third capacitor C3 may be electrically connected to the common signal line V.

The common signal line V may be in the gate metal layer M1. The first electrode C21 of the second capacitor C2 and the first electrode C31 of the third capacitor C3 may be both in the source/drain metal layer M2. The second electrode C22 of the second capacitor C2 and the second electrode C32 of the third capacitor C3 may be both in the gate metal layer M1.

In one embodiment, the first electrode C21 of the second capacitor C2 may be electrically connected to the second electrode C12 of the first capacitor C1, that is, the second electrode C12 of the first capacitor C1 and the first electrode C21 of the second capacitor C2 may have a same potential signal. The first electrode C31 of the third capacitor C3 may be electrically connected to the first electrode C11 of the first capacitor C1, that is, the first electrode C11 of the first capacitor C1 and the first electrode C31 of the third capacitor C3 may have a same potential signal. The substrate 100 may further include the common signal line V. The common signal line V may be configured to transmit the common signal to the second electrode C22 of the second capacitor C2 and the second electrode C32 of the third capacitor C3, which may maintain stable potentials of the first electrode C21 of the second capacitor C2 and the first electrode 31 of the third capacitor C3, that is, may respectively maintain the stable increased potential signal of the first electrode C11 of the first capacitor C1 and the stable low potential signal of the second electrode C12 of the first capacitor C1.

It should be noted that, in one embodiment, the second electrode C22 of the second capacitor C2 may be electrically connected to the common signal line V. The second electrode C32 of the third capacitor C3 may be electrically connected to the common signal line V. The common signal may be transmitted to the second electrode C22 of the second capacitor C2 and the second electrode C32 of the third capacitor C3 through the common signal line V. An external common signal (e.g., a common signal on the drive chip) may be also transmitted to the second electrode C22 of the second capacitor C2 and the second electrode C32 of the third capacitor C3 of each drive unit 400. The second electrode C22 of the second capacitor C2 and the second electrode C32 of the third capacitor C3 of each drive unit 400 may be electrically connected as an integrated structure (shown in FIG. 18), and then may externally connected to the common signal, which may be configured according to actual situations during the implementation.

In some optional embodiments, referring to FIG. 18, FIG. 19 and FIG. 20, the second electrode C12 of the first capacitor C1 and the first electrode C21 of the second capacitor C2 may be formed into an integrated structure.

The second electrode C22 of the second capacitor C2 and the second electrode C32 of the third capacitor C3 may be formed into an integrated structure.

The first electrode C21 of the second capacitor C2 and the first electrode C31 of the third capacitor C3 may be two separate structures.

In one embodiment, it may further describe that the second electrode C12 of the first capacitor C1 and the first electrode C21 of the second capacitor C2 may be formed into an integrated structure, and the second electrode C22 of the second capacitor C2 and the second electrode C32 of the third capacitor C3 may be formed into an integrated structure. The second electrode C12 of the first capacitor C1 and the first electrode C21 of the second capacitor C2 may both in the source/drain metal layer M2. The second electrode C22 of the second capacitor C2 and the second electrode C32 of the third capacitor C3 may both in the gate metal layer M1, which may be used to connect the common signal of the common signal line V. Therefore, the electrodes in the same layer may be configured as an integrated structure during the process, which may enable the second electrode C12 of the first electrode C1 and the first electrode C21 of the second capacitor C2 to receive the same potential signal and may also enable the second electrode C22 of the second electrode C2 and the second electrode C32 of the third capacitor C3 to receive the same potential signal, and may simplify the process, save process time and improve process efficiency.

Figure 21:
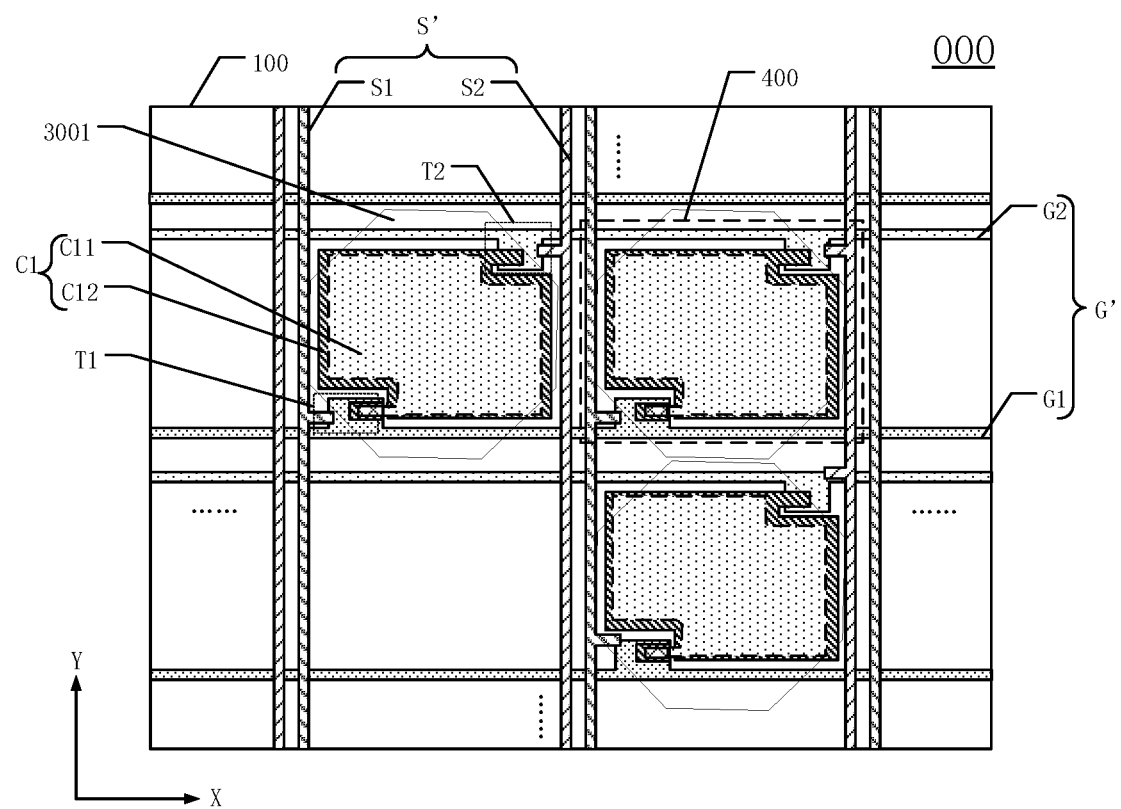
FIG. 21 illustrates another top-view structural schematic of a panel according embodiments of the present disclosure.
Figure 22:
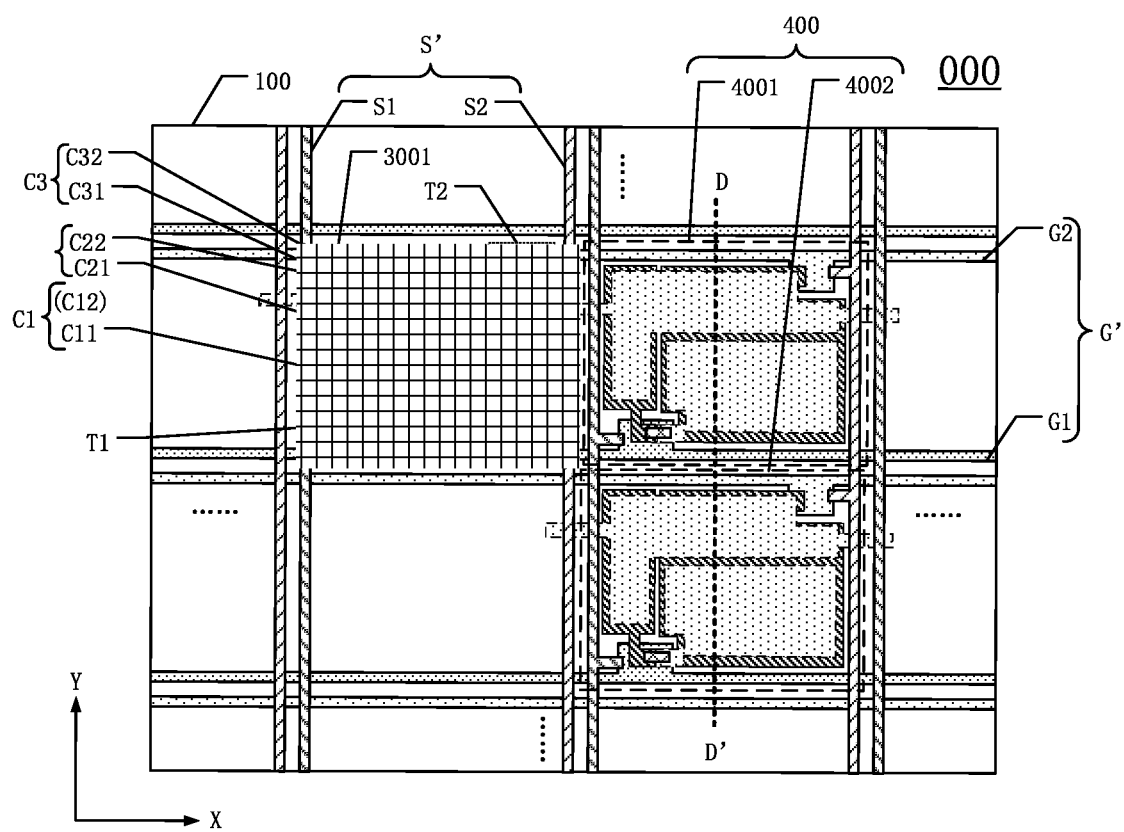
FIG. 22 illustrates another top-view structural schematic of a panel according embodiments of the present disclosure.

In some optional embodiments, referring to FIG. 15, FIG. 18 and FIG. 21, FIG. 21 illustrates another top-view structural schematic of a panel according embodiments of the present disclosure. In one embodiment, the shape orthographically projected on the substrate 100 from the drive electrode 3001 may be one of a semicircle, a square, a hexagon, an octagon, a rectangle, and a crescent.

In one embodiment, it may further describe the configured structural shapes of the drive electrode 3001. As shown in FIG. 15 and FIG. 18, the shape orthographically projected on the substrate 100 from the drive electrode 3001 may be a square, or one of other shapes, such as a semicircle (not shown), a hexagon, an octagon (shown in FIG. 21), a rectangle (not shown) and a crescent, and may not be limited to the shapes listed in one embodiment. The shape may be one of other shapes, which may only meet the requirement that the drive electrode 3001 may be a transparent conductive material and may cover the entire drive unit 400, so each drive unit 400 may correspond to each drive electrode 3001 and the drive unit 400 may provide the drive signal to the drive electrode 3001, which may not be described in detail in one embodiment.

Figure 23:
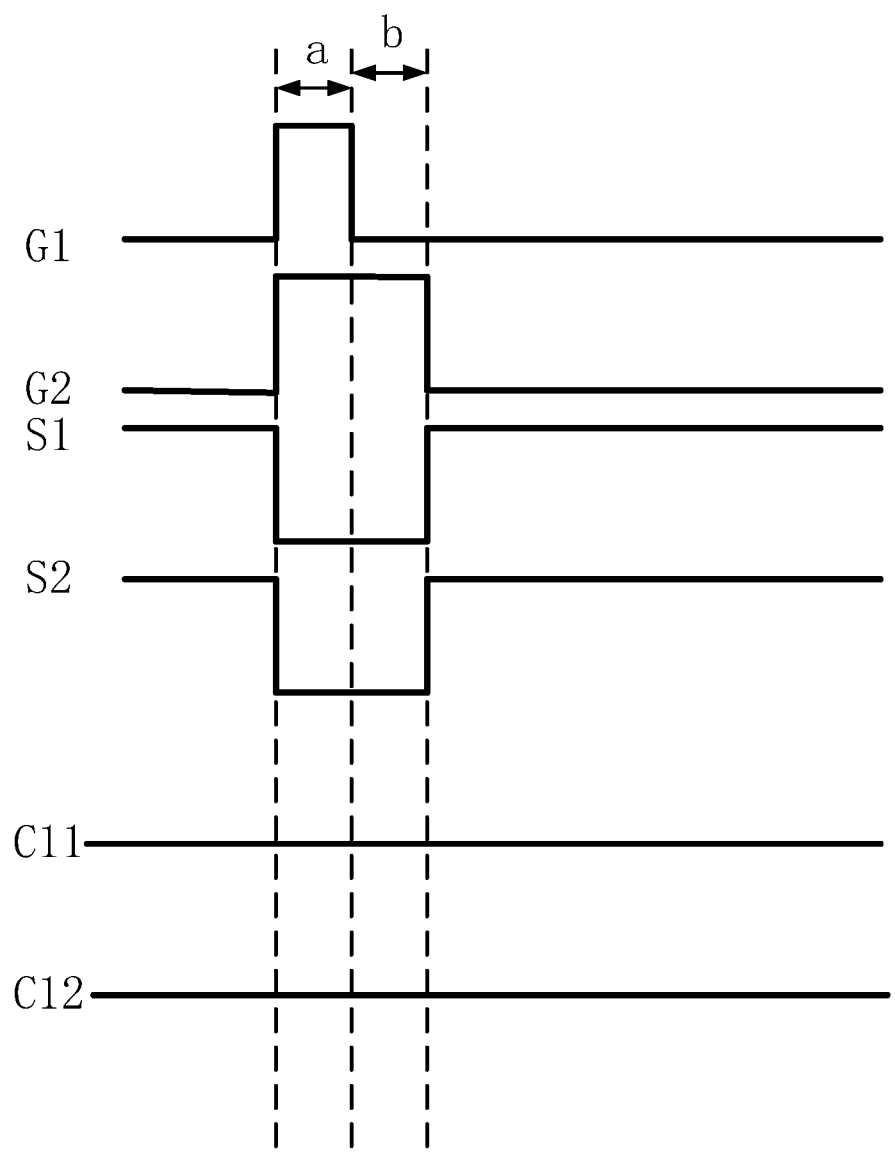
FIG. 23 illustrates a drive sequence schematic corresponding to a first drive unit in FIG. 22.
Figure 24:
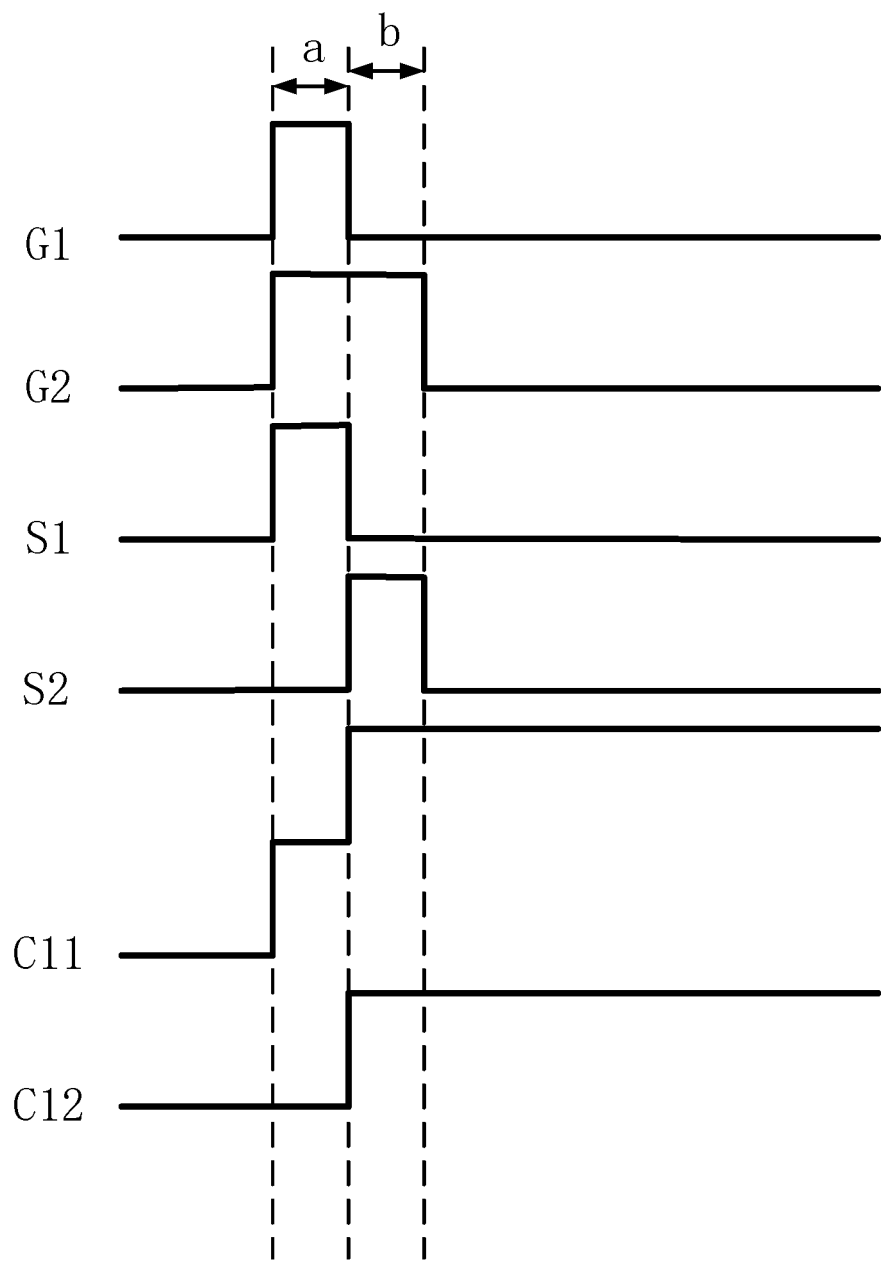
FIG. 24 illustrates a drive sequence schematic corresponding to a second drive unit in FIG. 22.

In some optional embodiments, referring to FIGS. 15-24, FIG. 22 illustrates another top-view structural schematic of a panel according embodiments of the present disclosure. FIG. 23 illustrates a drive sequence schematic corresponding to a first drive unit 4001 in FIG. 22. FIG. 24 illustrates a drive sequence schematic corresponding to a second drive unit 4002 in FIG. 22. A drive method of the panel 000 may be provided in one embodiment. The panel may be the panel 000 in the above-mentioned embodiments. The panel 000 may include the plurality of the drive units 400 arranged in an array. The drive method may include an electric field may be formed between adjacent drive electrodes 3001 on the panel 000 by modifying the potential signal received by the data line group S' of the two adjacent drive units 400. For example, the panel 000 may include the first drive unit 4001 and the second drive unit 4002, which are adjacent to each other, arranged in the second direction Y sequentially. The electric field may be formed between the first drive unit 4001 and the second drive unit 4002. As shown in the period a in FIG. 23 and FIG. 24, the first scan line G1 of the first drive unit 4001 and the second drive unit 4002 may receive a first enable signal, and the second scan line G2 may receive a second enable signal (it should be noted that, when all the transistors in the drive units are N-type transistors, the enable signal received by the scan line group G' may be the high potential signal which may enable the transistors to be conducting; when all the transistors in the drive units are P-type transistors, the enable signal received by the scan line group G' may need to be the low potential signal which may enable the transistors to be conducting; and all the N-type transistors may be used as an example for description in FIG. 23 and FIG. 24), which may make the first transistor T1 and the second transistor T2 to be conducting. The low potential signal may be transmitted to the data line group S' of the first drive unit 4001; the high potential signal may be transmitted to the first data line S1 of the second drive unit 4002; and the low potential signal may be transmitted to the second data line S2 of the second drive unit 4002. In such way, the potential of the first electrode C11 (the first electrode C11 of the first capacitor C1 may be electrically connected to the drive electrode 3001, so the potential signal of the first electrode C11 of the first capacitor C1 of the first drive unit 4001 in FIG. 22 may be the potential signal of the drive electrode of the first drive unit 4001) of the first capacitor C1 of the first drive unit 4001 may be the low potential signal, and the potential of the second electrode C12 of the first capacitor C1 may be the low potential signal. In addition, the potential of the first electrode C11 (the first electrode C11 of the first capacitor C1 may be electrically connected to the drive electrode 3001, so the potential signal of the first electrode C11 of the first capacitor C1 of the second drive unit 4002 in FIG. 22 may be the potential signal of the drive electrode of the second drive unit 4002) of the first capacitor C1 of the second drive unit 4002 may be the high potential signal, and the potential of the second electrode C12 of the first capacitor C1 may be the low potential signal. Therefore, the potential of the drive electrode 3001 of the first drive unit 4001 may be lower than the potential of the drive electrode 3001 of the second drive unit 4002.

As shown in the period b in FIG. 23 and FIG. 24, for the first drive unit 4001 and the second drive unit 4002, the first scan line G1 may disconnect the first enable signal and the second scan line G2 may continue to receive the second enable signal, which may make the first transistor T1 to be cutoff and may make the second transistor T2 to be conducting continuously. The low potential signal may continue to be transmitted to the data line group S' of the first drive unit 4001 and the first data line S1 of the second drive unit 4002, and the high potential signal may be transmitted to the second data line S2 of the second drive unit 4002. In such way, the potential of the first electrode C11 of the first capacitor C1 of the second drive unit 4002 (the first electrode C11 of the first capacitor C1 may be electrically connected to the drive electrode 3001, so the potential signal of the first electrode C11 of the first capacitor C1 of the second drive unit 4002 in FIG. 22 may be the potential signal of the drive electrode of the second drive unit 4002) may be further increased due to the coupling effect. Therefore, the potential of the drive electrode 3001 of the first drive unit 4001 may be further lower than the potential of the drive electrode 3001 of the second drive unit 4002.

Figure 25:
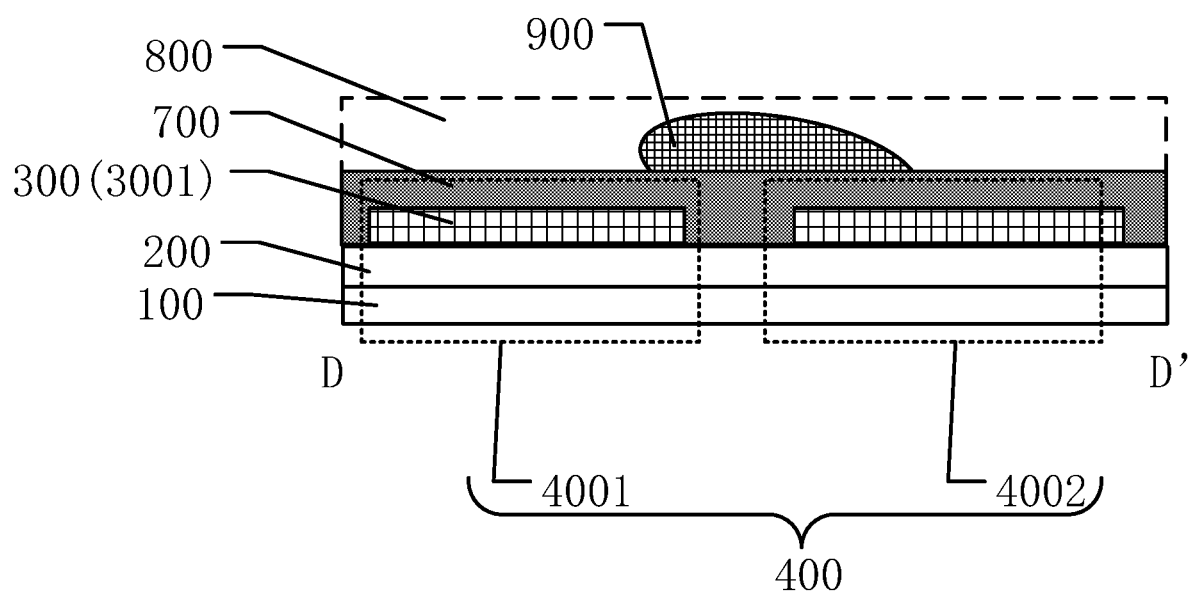
FIG. 25 illustrates a cross-sectional structural schematic along a D-D' direction in FIG. 22.

The adjacent two drive units 400 (the first drive unit 4001 and the second drive unit 4002) in combination with their corresponding drive sequence may be described in one embodiment, including how to make the potential of the drive electrode 3001 of the first drive unit 4001 lower than the potential of the drive electrode 3001 of the second drive unit 4002, and further increase the potential of the drive electrode 3001 of the second drive unit 4002, which makes the large potential difference of the drive electrodes of the two drive units 400. In one embodiment, the panel 000 may be applied to the microfluidic chip based on a dielectric electrowetting technique, and an electric field may be formed by the potential difference between adjacent drive units 400, thereby generating a pressure difference and an asymmetrical deformation inside the liquid droplets by the electric field, and further driving the droplets to move in a directional manner. Optionally, referring to FIG. 25, FIG. 25 illustrates a cross-sectional structural schematic along a D-D' direction in FIG. 22 (in order to illustrate the technical solution of one embodiment, only a portion of the film layer structure of the panel 000 may be shown in the cross-sectional view of FIG. 25 for description, and the other portions of the film layer structure of the panel may be understood in conjunction with FIG. 16, FIG. 17, FIG. 19 and FIG. 20). A hydrophobic layer 700 may be also included at the side of the electrode array layer 300 of the panel away from the substrate 100. A microfluidic channel layer 800 (not filled in FIG. 25) may be also included at the side of the hydrophobic layer 700 away from the substrate 100 and may be used for the movement of a liquid droplet 900. The drive method of the panel provided in one embodiment may make the potential difference between two adjacent drive units 400 to be sufficiently large, so a higher drive voltage may be provided to move the liquid droplet 900 normally.

It should be noted that, in one embodiment, the liquid droplet 900 may be a liquid having conductivity and may include a biological sample or a chemical substance composed of a single component or a plurality of components. In one embodiment, the liquid droplet 900 may be negative charged as an example, and the liquid droplet 900 may move in a opposite direction of the electric field line. As an example, the panel 000 may be applied to the microfluidic chip that may require a relatively large drive voltage in one embodiment, which may not be limited to the application scenario. The panel 000 may also be applied to other structures that may require a high voltage drive, which may not be limited in one embodiment.

It should be further noted that, during the period b, the first scan line G1 may input the low potential signal to the gate of the first transistor T1, and the second scan line G2 may continue to input the high potential signal to the gate of the second transistor T2, so the time of maintaining the high potential signal by the second scan line G2 may be longer than the time of maintaining the high potential signal by the first scan line G1, as shown in FIG. 23 and FIG. 24. Optionally, the time of maintaining the high potential signal by the second scan line G2 may be twice the time of maintaining the high potential signal by the first scan line G1.

In some optional embodiments, referring to FIGS. 22-25, the range of the potential signal difference between the drive electrodes 3001 corresponding to the adjacent two drive units 400 may be about 30 V to about 60 V.

In one embodiment, it may further define the normal drive voltage required for the droplet movement may be affected by various manufacturing process factors when the panel 000 may be applied to the microfluidic chip based on the dielectric wetting technique. Each chip may have a normal drive threshold, and the droplet may be distorted or moved when the voltage value on the adjacent drive electrodes 3001 is greater than or equal to the drive threshold. Therefore, the range of the potential signal difference between the drive electrodes 3001 corresponding to the adjacent two drive units 400 may be defined as about 30 V to about 60 V in one embodiment, which may make the droplet to move normally on the panel 000.

In some optional embodiments, referring to FIGS. 22-25, before forming the electric field between the first drive unit 4001 and the second drive unit 4002, the method may further confirm positions of the first drive unit 4001 and the second drive unit 4002, which are required for forming the electric field.

In one embodiment, it may further describe that, before forming the electric field between the first drive unit 4001 and the second drive unit 4002, the positions of the first drive unit 4001 and the second drive unit 4002, which are required for forming the electric field, may be confirmed. Therefore, different high/low potential signals may be respectively provided to the data line group S' of the first drive unit 4001 and the second drive unit 4002 through the position determination, and the electric field may be formed between the first drive unit 4001 and the second drive unit 4002. If the drive units 400 at other positions have no drive tasks, the data line group S' may not provide the potential signal, which may be advantageous to save resources and improve work efficiency.

Figure 26:
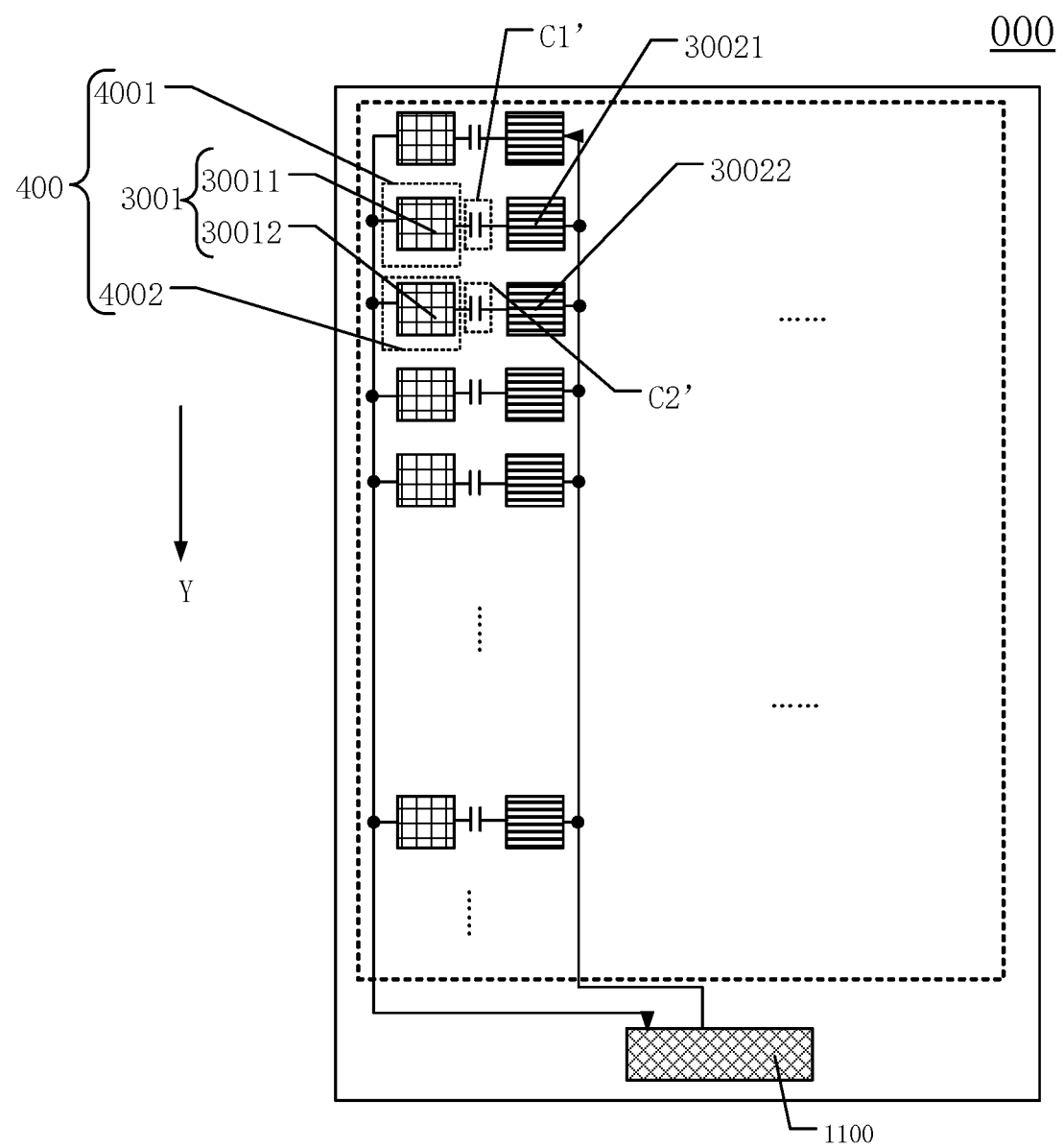
FIG. 26 illustrates a principle structural schematic of confirming positions of a first drive unit and a second drive unit according embodiments of the present disclosure.

In some optional embodiments, referring to FIG. 26, FIG. 26 illustrates a principle structural schematic of confirming positions of the first drive unit 4001 and the second drive unit 4002 according embodiments of the present disclosure. In one embodiment, the positions of the first drive unit 4001 and the second drive unit 4002, which are required for forming the electric field, may be confirmed.

For example, the first drive unit 4001 may correspond to the first drive electrode 30011, and the second drive unit 4002 may be correspond to the second drive electrode 30012.

A first auxiliary electrode 30021 may be disposed on the side of the first drive electrode 30011, and a second auxiliary electrode 30022 may be disposed on the side of the second drive electrode 30012. The panel may include a detection chip 1100 which may be electrically connected to each of the first auxiliary electrode 30021, the second auxiliary electrode 30022, the first drive electrode 30011 and the second drive electrode 30012 respectively.

The first drive electrode 30011 and the first auxiliary electrode 30021 may form a first detection capacitor C1', and the second drive electrode 30012 and the second auxiliary electrode 30022 may form a second detection capacitor C2'. The positions of the first drive unit 4001 and the second drive unit 4002, which may be required for forming the electric field, may be confirmed according to different detection signals received by the detection chip 1100.

In some optional embodiments, the panel 000 of the above-mentioned embodiments may be applied to the microfluidic chip. When the area of each drive unit 400 is sufficiently large and the moving path of the droplet 900 in the microfluidic channel layer 800 is visible to human eyes, the positions of the first drive unit 4001 and the second drive unit 4002, which may be required for forming the electric field, may be confirmed by human eyes. That is, the current position of the drive unit 40 where the droplet 90 may be located and the position of the drive unit 40 where the droplet 90 may need to be moved may be confirmed by human eyes. However, in other optional embodiments, the moving path of the droplet 900 in the microfluidic channel layer 800 may not be visible to human eyes. For example, the panel 000 may has a large number of the drive units 400, resulting a small area of each drive unit 400; or a cover (not shown in FIG. 26) of the panel 000 may be disposed on the side of the microfluidic channel layer 800 away from the substrate 100, and the cover and the substrate 100 may form a sealed box. Therefore, the positions of the first drive unit 4001 and the second drive unit 4002, which may be required for forming the electric field may not be confirmed by human eyes.

In one embodiment, the first auxiliary electrode 30021 may be disposed on the side of the first drive electrode 30011 and the second auxiliary electrode 30022 may be disposed on the side of the second drive electrode 30012. In addition, the panel may include the disposed detection chip 1100 which may be electrically connected to each of the first auxiliary electrode 30021, the second auxiliary electrode 30022, the first drive electrode 30011 and the second drive electrode 30012 respectively. In such way, the positions of the first drive unit 4001 and the second drive unit 4002 may be determined. The first auxiliary electrode 30021 and the second auxiliary electrode 30022 may be used as the detection input terminal, so the potential signal may be transmitted to the first drive electrode 30011 and the second drive electrode 30012 through the drive unit 400. However, the first auxiliary electrode 30021 and the second auxiliary electrode 30022 may transmit the high/low potential signal different from the first drive electrode 30011 and the second drive electrode 30012 through the detection chip 1100. In such way, the first drive electrode 30011 and the first auxiliary electrode 30021 may form the first detection capacitor C1', and the second drive electrode 30012 and the second auxiliary electrode 30022 may form the second detection capacitor C2'. The position of the liquid droplet may be determined according to the different value of the capacitance detected by the detection chip 1100, and the positions of the first drive unit 4001 and the second drive unit 4002, which may be required for forming the electric field, may be further confirmed. That is, the current position of the drive unit 400 where the liquid droplet 900 may be located and the position of the next drive unit 400 where the liquid droplet 900 may need to be moved may be confirmed. Whether the liquid droplet 900 may reach the position of a certain drive unit 400, the detection capacitance values between the drive electrode 3001 and the auxiliary electrode at the position may be different. Therefore, the positions of the first drive unit 4001 and the second drive unit 4002, which may be required for forming the electric field, may be confirmed according the values of the first detection capacitance C1' and the second detection capacitance C2'.

In some optional embodiments, the drive method of the panel may further include sequentially providing signals to the first scan line G1 of the scan line group G' and to the second scan line G2 of the scan line group G'. Before conforming the positions of the first drive unit 4001 and the second drive unit 4002 which may be required for forming the electric field, the drive method may provide the low potential signal to the data line group S'.

In one embodiment, it may further describe that the drive method of the panel may further include sequentially providing signals to the first scan line G1 of the scan line group G' and to the second scan line G2 of the scan line group G'. Before conforming the positions of the first drive unit 4001 and the second drive unit 4002, which may be required for forming the electric field, the drive method may provide the low potential signal to the data line group S'. The low potential signal may be supplied through the data line group S' which may make each potential signal of the drive electrode of each drive unit 400 to be the low potential signal, so the drive unit 400 of the panel 000 may perform a signal initialization. Then, the positions of the first drive unit 4001 and the second drive unit 4002, which may be required for forming the electric field, may be confirmed, which can avoid the interference of the signal of other drive units 400.

From the above-mentioned embodiments, it can be seen that the display panel and the display device provided by the present disclosure may achieve at least the following beneficial effects.

The drive circuit provided by the present disclosure may transmit the signal of the third signal input terminal to the first electrode of the first capacitor through the first module, and may transmit the signal of the fourth signal input terminal to the second electrode of the first capacitor through the second module at the first time period, which may generate a voltage difference between the first electrode and the second electrode of the first capacitor. Then, the current signal of the fourth signal input terminal may be transmitted to the second electrode of the first capacitor through the second module at the second time period. Currently, the first module may not operate, and the first capacitor may be subject to the coupling effect where a voltage difference between two electrodes of the first capacitor may remain unchanged; and the signal of the fourth signal input terminal may be transmitted to the second electrode of the first capacitor through the second module. Therefore, the signal of the first electrode of the first capacitor may be further increased. In the present disclosure, the input signals of the first signal input terminal and the second signal input terminal may control the conduction of the first module and the second module at the first time period, and may control the turn-off of the first module and conduction of the second module at the second time period, and may respectively transmit the signals of the third signal input terminal and the fourth signal input terminal to the two electrodes of the first capacitor at the two time periods. Therefore, after forming the voltage difference between the first electrode and the second electrode of the first capacitor, the potential signal of the first electrode of the first capacitor may be further increased to obtain a higher potential signal, thereby implementing the function of low voltage input and high voltage output of the drive circuit, which may be advantageous to implement the step-up drive circuit. Moreover, the drive circuit provided in one embodiment may be applied to a microfluidic device, and the drive chip providing the drive signal may not need to configure a large number of signal channels when the microfluidic device needs a large number of drive electrodes to simultaneously perform chemical micro-reactions or substance detections of large quantities of samples, which may be advantageous to reduce the computational difficulty of the drive chip, and to provide a sufficient high drive voltage for the droplets to move normally.

The details of the present disclosure have been described through the embodiments provided above. However, those skilled in the art should understand that the disclosed embodiments are exemplary only and are not intended to limit the scope of the present disclosure. Those skilled in the art should understand that the disclosed embodiments can be modified according to the scope and principles of the present disclosure. The scope of the present disclosure is defined by the appended claims and their equivalents.

What is claimed is:

1. A panel, comprising:
a substrate, an array layer and an electrode array layer, wherein:
the array layer is on a side of the substrate; the electrode array layer is on a side of the array layer away from the substrate; and the array layer includes an active layer, a gate metal layer and a source/drain metal layer;
the substrate includes a plurality of drive units arranged in an array, a plurality of scan line groups and a plurality of data line groups;
the scan line group includes first scan lines and second scan lines adjacent to the first scan lines, extending in a first direction; and the data line group includes first data lines and second data lines adjacent to the first data lines, extending in a second direction, wherein the first direction is perpendicular with the second direction;
the electrode array layer includes a plurality of drive electrodes arranged in an array; the drive electrodes correspond to the drive units; and the drive unit includes a first transistor, a second transistor and a first capacitor;
a gate of the first transistor is electrically connected to the first scan line; a source of the first transistor is electrically connected to the first data line; a drain of the first transistor is electrically connected to the drive electrode; and the drive electrode is electrically connected to a first electrode of the first capacitor;
a gate of the second transistor is electrically connected to the second scan line; a source of the second transistor is electrically connected to the second data line; and a drain of the second transistor is electrically connected to a second electrode of the first capacitor;
the scan line group, the gate of the first transistor and the gate of the second transistor are adjacent to a same insulating layer as the gate metal layer; and the data line group, the source and drain of the first transistor and the source and drain of the second transistor are all in the source/drain metal layer; and
the first electrode of the first capacitor is in the gate metal layer and the electrode array layer, and the second electrode of the first capacitor is in the source/drain metal layer.

2. The panel according to claim 1, wherein:
the first scan line and the second scan line of the one scan line group are respectively between two adjacent drive units in the second direction;
the first data line and the second data line of the one data line group are respectively between two adjacent drive units in the first direction; and one first scan line and one second scan line on the both sides of the drive unit in the second direction, and one first data line and one second data line on the both sides of the drive unit in the first direction insulatively intersect to define a region for the drive unit.

3. The panel according to claim 1, wherein:
the drain of the first transistor is electrically connected to the drive electrode through a first via, and the drive electrode is electrically connected to the first electrode of the first capacitor through a second via.

4. The panel according to claim 1, wherein:
the substrate further includes a common signal line; the drive unit further includes a second capacitor and a third capacitor; a first electrode of the second capacitor is electrically connected to the second electrode of the first capacitor, and a second electrode of the second capacitor is electrically connected to the common signal line; a first electrode of the third capacitor is electrically connected to the first electrode of the first capacitor, and a second electrode of the third capacitor is electrically connected to the common signal line; and
the common signal line is in the gate metal layer; the first electrode of the second capacitor and the first electrode of the third capacitor are both in the source/drain metal layer;
and the second electrode of the second capacitor and the second electrode of the third capacitor are both in the gate metal layer.

5. The panel according to claim 4, wherein:
the second electrode of the first capacitor and the first electrode of the second capacitor are formed into an integrated structure;
the second electrode of the second capacitor and the second electrode of the third capacitor are formed into an integrated structure; and
the first electrode of the second capacitor and the first electrode of the third capacitor are two separate structures.

6. The panel according to claim 1, wherein:
an orthographic projection shape of the drive electrode on the substrate is one of a semicircle, a square, a hexagon, an octagon, a rectangle and a crescent.

7. A drive method of a panel including the panel according to claim 1, wherein the panel includes a plurality of drive units arranged in an array, the method comprising:
forming an electric field between adjacent drive electrodes on the panel by modifying potential signals received from the data line group of two adjacent drive units, wherein:
the panel includes a first drive unit and a second drive unit, which are adjacent to each other, arranged in the second direction sequentially; the electric field is formed between the first drive unit and the second drive unit; for the first drive unit and the second drive unit, the first scan line is configured to receive a first enable signal and the second scan line is configured to receive a second enable signal, which makes the first transistor and the second transistor to be conducting; a low potential signal is transmitted to the data line group of the first drive unit, a high potential signal is transmitted to the first data line of the second drive unit and a low potential signal is transmitted to the second data line of the second drive unit, which makes the potential of the first electrode of the first capacitor of the first drive unit to be the low potential signal, makes the potential of the second electrode of the first capacitor of the first drive unit to be the low potential signal, makes the potential of the first electrode of the first capacitor of the second drive unit to be the high potential signal, and makes the potential of the second electrode of the first capacitor of the second drive to be the low potential signal; such that the potential of the drive electrode of the first drive unit is lower than the potential of the drive electrode of the second drive unit; and for the first drive unit and the second drive unit, the first scan line disconnects the first enable signal and the second scan line continues to receive the second enable signal, which makes the first transistor to be cutoff and makes the second transistor continue to be conducting; the low potential signal continues to be transmitted to the data line group of the first drive unit, the low potential signal continues to be transmitted to the first data line of the second drive unit, and the high potential signal continues to be transmitted to the second data line of the second drive unit, which makes the potential of the first electrode of the first capacitor of the second drive unit to be further increased, such that the potential of the drive electrode of the first drive unit is further lower than the potential of the drive electrode of the second drive unit.

8. The drive method according to claim 7, wherein:
a range of the potential signal difference between the drive electrodes corresponding to the two adjacent drive units is about 30 V to about 60 V.

9. The drive method according to claim 7, before forming the electric field between the first drive unit and the second drive unit, further including:
confirming positions of the first drive unit and the second drive unit, required for forming the electric field.

10. The drive method according to claim 9, wherein the positions of the first drive unit and the second drive unit, which are required for forming the electric field, are confirmed, wherein:
the first drive unit corresponds to the first drive electrode, and the second drive unit corresponds to the second drive electrode;
a first auxiliary electrode is disposed on a side of the first drive electrode, and a second auxiliary electrode is disposed on the side of the second drive electrode; and the panel further includes a detection chip which is electrically connected to each of the first auxiliary electrode, the second auxiliary electrode, the first drive electrode and the second drive electrode respectively; and
the first drive electrode and the first auxiliary electrode form a first detection capacitor, and the second drive electrode and the second auxiliary electrode form a second detection capacitor; and the positions of the first drive unit and the second drive unit, which are required for forming the electric field, are confirmed according to different detection signals received by the detection chip.

11. The drive method according to claim 7, wherein:
signals are sequentially provided to the first scan lines of the scan line group and to the second scan lines of the scan line group; and, before confirming the positions of the first drive unit and the second drive unit which are required for forming the electric field, the low potential signal is provided to the data line group.

12. A panel, comprising:
a substrate, an array layer, and an electrode array layer, wherein:
the array layer is on a side of the substrate; the electrode array layer is on a side of the array layer away from the substrate; and the array layer includes an active layer, a gate metal layer, and a source/drain metal layer;
the substrate includes a plurality of drive units arranged in an array, a plurality of scan lines and a plurality of data lines;
the plurality of scan lines extend in a first direction, the plurality of data lines extend in a second direction, wherein the first direction is perpendicular with the second direction;
the electrode array layer includes a plurality of drive electrodes arranged in an array; the drive electrodes correspond to the drive units; and the drive unit includes a first transistor and a capacitor;
a gate of the first transistor is electrically connected to the plurality of scan lines; a source of the first transistor is electrically connected to the plurality of data lines; a drain of the first transistor is electrically connected to the drive electrode; and the drive electrode is electrically connected to a first electrode of the capacitor;
the drive electrode overlaps at least one of the plurality of data lines and the plurality of scan lines;
the plurality of scan lines and the gate of the first transistor are all in-adjacent to a same insulating layer as the gate metal layer; and the plurality of data lines and the source and drain of the first transistor are all in the source/drain metal layer; and
the first electrode of the capacitor is in the gate metal layer and the electrode array layer, and the second electrode of the capacitor is in the source/drain metal layer.

13. The panel according to claim 12, further comprising:
an insulating hydrophobic layer disposed at a side of the electrode array layer away from the substrate.

14. The panel according to claim 13, wherein:
the drive electrode is made of a material including indium tin oxide.

15. The panel according to claim 13, wherein:
a second electrode of the capacitor is disposed in the gate metal layer.

16. The panel according to claim 15, further comprising:
a plurality of common signal lines electrically connected with the second electrode of the capacitor.

17. The panel according to claim 15, wherein:
an insulation layer is disposed between the electrode array layer and the array layer.

18. The panel according to claim 15, wherein:
an orthographic projection shape of the drive electrode on the substrate is one of a semicircle, a square, a hexagon, an octagon, a rectangle, and a crescent.

19. The panel according to claim 15, wherein:
the capacitor includes a first capacitor and a second capacitor.

* * * * *